US011603685B2

(12) United States Patent
Holzapfel

(10) Patent No.: US 11,603,685 B2
(45) Date of Patent: Mar. 14, 2023

(54) SYSTEM AND ASSOCIATED METHODS FOR ADVERTISING FROM A TRAFFIC SIGNAL CONTROL CABINET

(71) Applicant: On Street Media, USA, LLC, Winter Park, FL (US)

(72) Inventor: Joseph Holzapfel, Ralston, NE (US)

(*) Notice: Subject to any disclaimer, the term of this patent is extended or adjusted under 35 U.S.C. 154(b) by 199 days.

(21) Appl. No.: 16/813,279

(22) Filed: Mar. 9, 2020

(65) Prior Publication Data

US 2020/0208448 A1 Jul. 2, 2020

Related U.S. Application Data

(63) Continuation-in-part of application No. 15/595,478, filed on May 15, 2017, now Pat. No. 10,586,477, which is a continuation-in-part of application No. 14/974,543, filed on Dec. 18, 2015, now Pat. No. 9,918,549.

(60) Provisional application No. 62/093,456, filed on Dec. 18, 2014.

(51) Int. Cl.
*E05C 19/00* (2006.01)
*H05K 5/02* (2006.01)
*E05B 9/02* (2006.01)

(52) U.S. Cl.
CPC .............. *E05C 19/003* (2013.01); *E05B 9/02* (2013.01); *H05K 5/0221* (2013.01)

(58) Field of Classification Search
CPC ........ E05C 19/003; E05B 9/02; H05K 5/0221
See application file for complete search history.

(56) References Cited

U.S. PATENT DOCUMENTS

| | | | | |
|---|---|---|---|---|
| 5,605,364 A | * | 2/1997 | Shelledy | E05C 19/003 292/259 R |
| 5,622,397 A | * | 4/1997 | Rice | E05C 19/003 292/259 R |
| 7,661,733 B1 | * | 2/2010 | Angel | E05C 19/003 292/259 R |
| 10,128,612 B1 | * | 11/2018 | Casto | H01R 13/52 |
| 10,285,288 B1 | * | 5/2019 | Su | H05K 5/03 |
| 2011/0203335 A1 | * | 8/2011 | DeWalch | E05B 65/0888 70/158 |
| 2014/0361551 A1 | * | 12/2014 | Rickman | E05C 19/186 292/155 |
| 2015/0300628 A1 | * | 10/2015 | Dunn | A47F 11/10 362/125 |

(Continued)

*Primary Examiner* — Gary C Hoge
(74) *Attorney, Agent, or Firm* — Greenberg Traurig, P.A.

(57) ABSTRACT

An advertising medium includes a frame enclosing a traffic signal control cabinet. The frame includes opposing rails for each side of the cabinet with opposing inside surfaces of the rails including grooves extending longitudinally along the rail and spaced from each other. A light panel is carried within one groove near, yet spaced from, surfaces of cabinet walls. An advertising panel is carried within a second groove. The advertising panel is spaced from the light panel and on an opposite side from the cabinet wall. A clear protective panel is carried within a third groove and opposite an outer surface of the advertising panel. Tie rods extend between lock devices which are secured to the rails such that removing the frame from its position around the cabinet is prevented. As a result, advertising material may be secured to a traffic signal control cabinet without intruding upon or modifying the cabinet.

12 Claims, 35 Drawing Sheets

(56) References Cited

U.S. PATENT DOCUMENTS

2017/0190509 A1* 7/2017 Reeb .................... B65F 1/1615

* cited by examiner

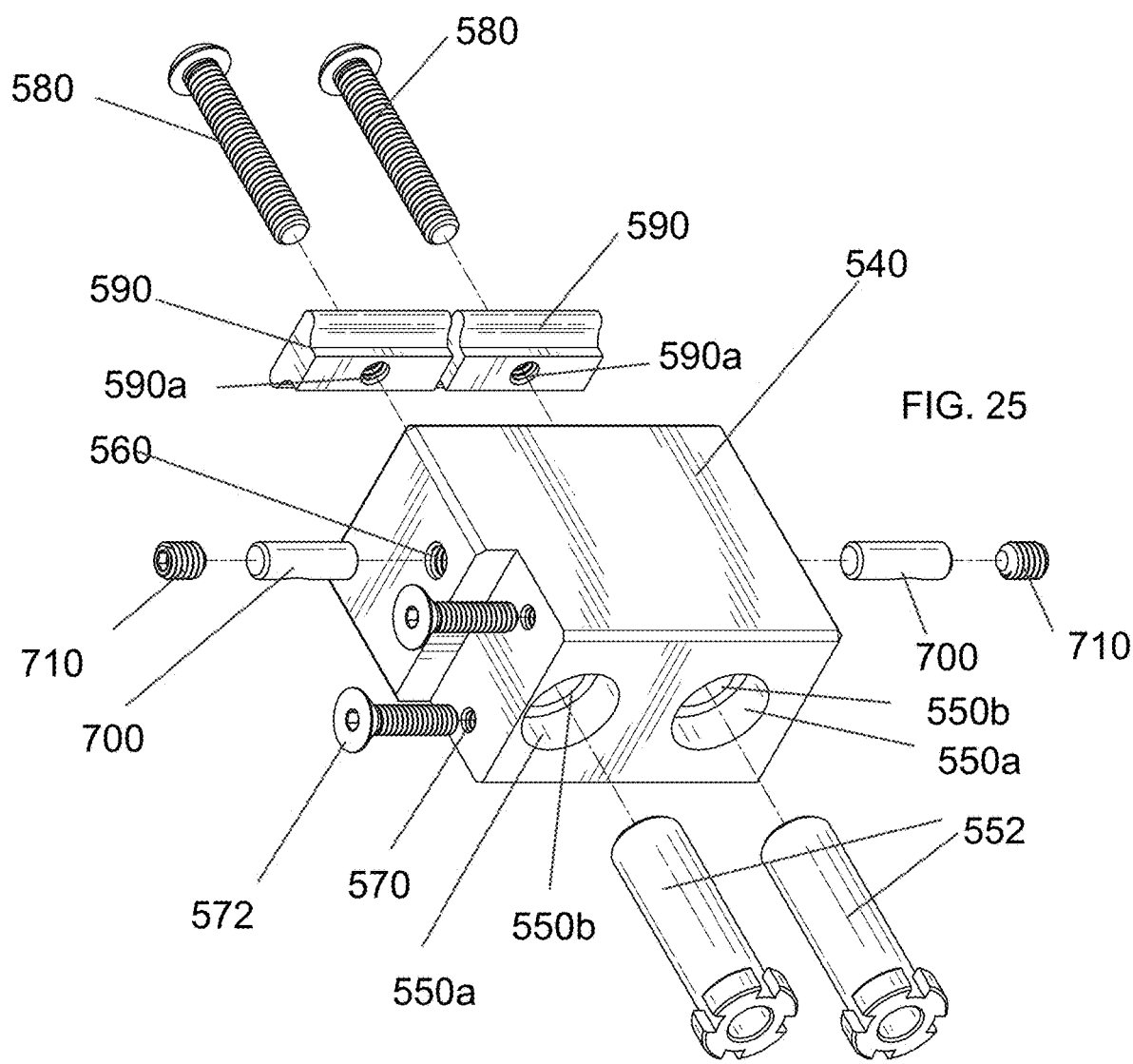

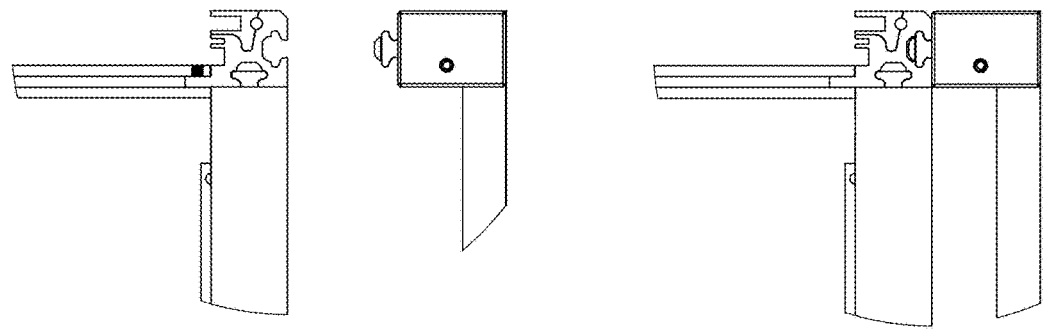
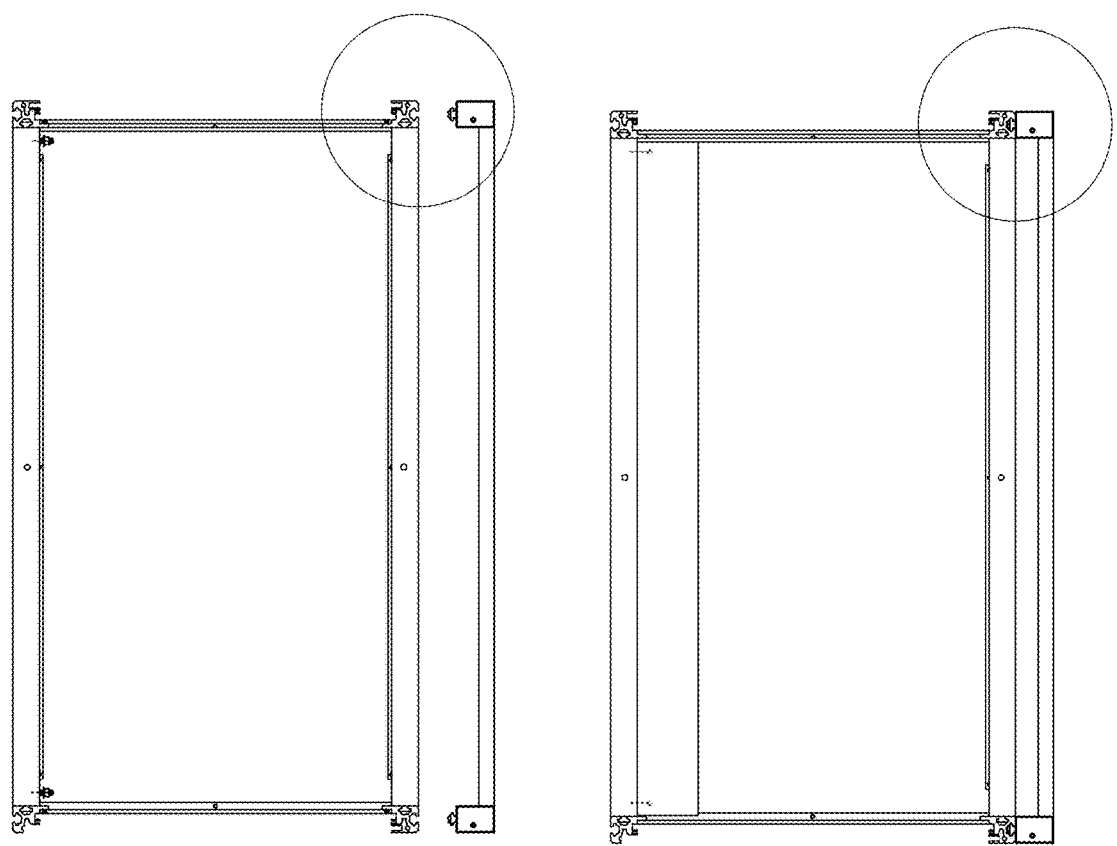
FIG. 35

SYSTEM AND ASSOCIATED METHODS FOR ADVERTISING FROM A TRAFFIC SIGNAL CONTROL CABINET

CROSS REFERENCE TO RELATED APPLICATIONS

This application is a continuation-in-part of, and claims priority to, U.S. patent application Ser. No. 15/595,478 entitled "System and Associated Methods for Advertising from a Traffic Signal Control Cabinet" filed May 15, 2017, which itself is a continuation-in-part of, and claims priority to, U.S. patent application Ser. No. 14/974,543 entitled "System and Associated Methods for Advertising from a Traffic Signal Control Cabinet" filed Dec. 18, 2015, which itself claims priority to U.S. Provisional Application Ser. No. 62/093,456, filed Dec. 18, 2014, the contents of which are incorporated by reference and commonly owned.

FIELD OF THE INVENTION

The present invention generally relates to advertising display devices and in particular to an advertising system mountable on a cabinet structure without jeopardizing integrity of the cabinet structure with a robust locking mechanism.

BACKGROUND

Advertising media take on a variety of forms as do the devices designed to secure the advertising media to a structural support while allowing clear public view. Examples of such devices are included in U.S. Pat. No. 7,096,625 to Hering for "A Method of Displaying Advertising on a Turnstile" and U.S. Pat. No. 6,092,319 to Hicks for an "Apparatus for Connecting Advertising Substrate to Trucks." Yet further and as disclosed in U.S. Application Publication No. 2001/0035701 to Holzheid for "Framing for Public Space Housings to Hold and to Facilitate Display of Visual Materials," outdoor cabinets such as traffic control boxes provide potential sites for advertising and provide a source of advertising revenue.

As disclosed in Holzheid, equipment must be protected from the elements as well as vandalism or other destruction by humans. In many cases, the equipment is protected by a housing for traffic signal control boxes, which are especially susceptible to vandalism. Traffic signal control boxes are generally vertical structures positioned at street intersections for the purpose of housing the electronics needed to control traffic signals at the intersections. For example, while traffic control cabinets generally located at each intersection having traffic lights have blank space on side walls, municipalities frown on "bumper sticker" styled signs stuck to the side walls and such signs are difficult to remove. Accordingly, there is a need in the art for providing an advertising option for advertising from such traffic control cabinets without the need for intrusion into the cabinet walls surfaces and with ease in replacing advertising indicia. Yet further, while outer coverings for such housings may be known, there remains a need to attach such covers and thus possible advertising media to the housings without intruding or modifying the housing. The embodiments disclosed herein are aimed at overcoming these and other needs in the art.

SUMMARY

Embodiments of the present invention are herein described by way of example and directed to advertising display methods and devices mountable on a cabinet structure without jeopardizing the integrity of the cabinet.

By way of example in satisfying a need, embodiments of the invention permit signage, such as advertising, to be placed on a traffic signal control cabinet, or the like, without scratching, marring, or discoloring the original surface of the cabinet, and further without being invasive in any way to the cabinet or its function. Further, the signage may be carried by the cabinet without interfering with the cabinet access door. Embodiments of the invention permit a frictional attachment of the signage while withstanding relatively high winds and severe weather without damage to the signage. Signage may be attached to any or all sides of the cabinet while having the attaching means inaccessible to the general public.

One embodiment provides an advertising medium which may comprise a frame enclosing a traffic signal control cabinet. The frame may include opposing rails for each side of the cabinet with opposing inside surfaces of the rails including grooves extending longitudinally along the rail and spaced from each other. A light panel may be carried within one groove near, yet spaced from, surfaces of cabinet walls. An advertising panel may be carried within a second groove. The advertising panel is spaced from the light panel and on an opposite side from the cabinet wall. A clear protective panel may be carried within a third groove and opposite an outer surface of the advertising panel. Tie rods may extend between lock devices which are secured to the rails such that removing the frame from its position around the cabinet is prevented. Each lock device is generally comprised of a plurality of bores and bolts and secured using a key. As a result, advertising material may be secured to the traffic signal control cabinet without intruding or modifying the cabinet.

BRIEF DESCRIPTION OF DRAWINGS

For a fuller understanding of the invention, reference is made to the following detailed description, taken in connection with the accompanying drawings in which:

FIG. 25 is an exploded view of the embodiment depicted in FIGS. 24A and 24B;

FIGS. 34 and 35 depict embodiments of a locking assembly in conjunction with exemplary rails of the present disclosure.

DETAILED DESCRIPTION OF EMBODIMENTS

The teachings of the present invention will now be described more fully hereinafter with reference to the accompanying drawings, in which embodiments of the invention are shown by way of illustration and non-limiting example. This invention may be embodied in many forms and should not be construed as limited to the embodiments set forth herein. Rather, these embodiments are provided so that this disclosure will be thorough and complete, and will fully convey the scope of the invention to those skilled in the art.

Figure 1:
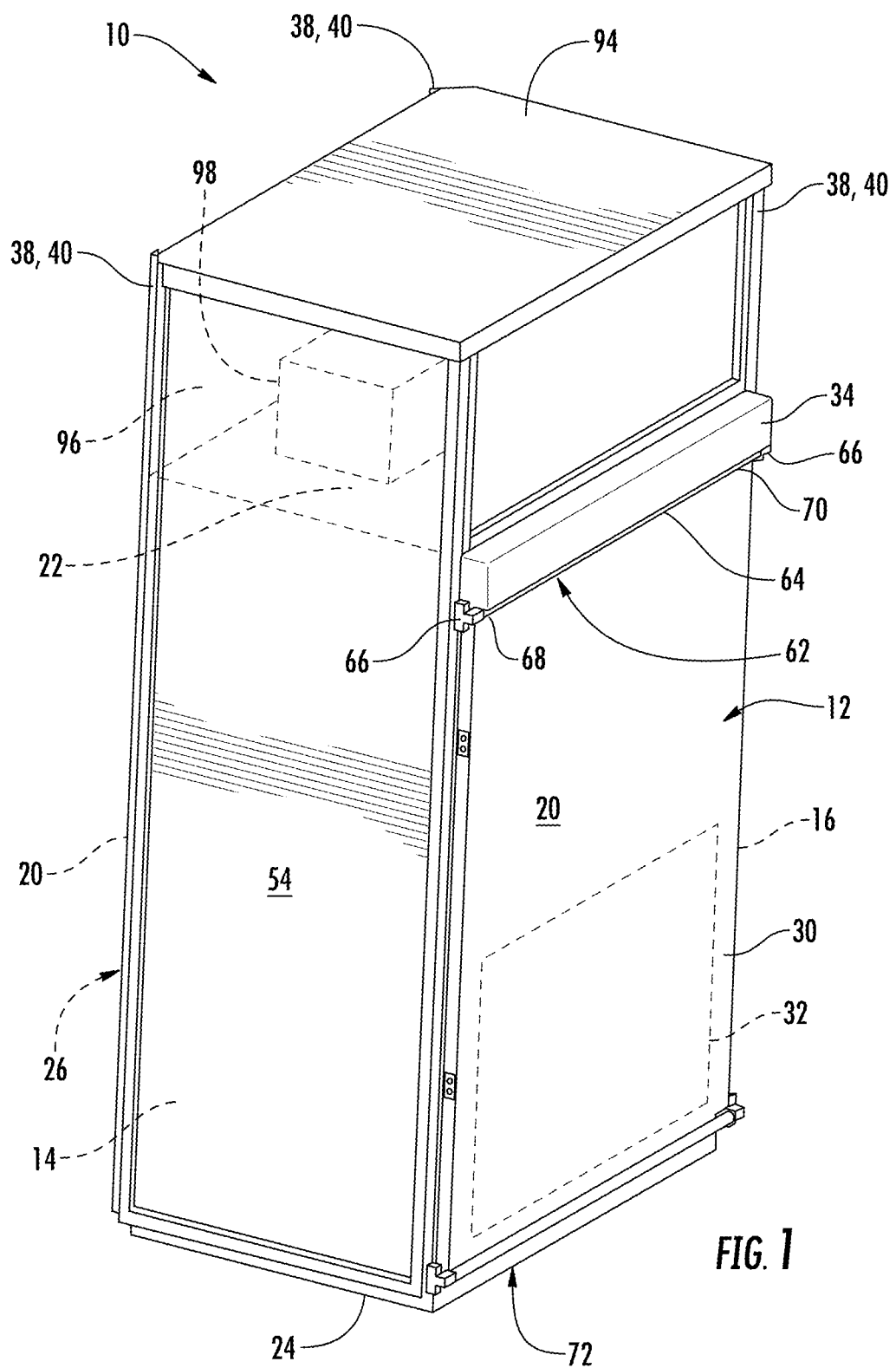
FIG. 1 is a perspective view of one embodiment of the present invention including an advertising medium secured to a traffic signal control cabinet.

With reference initially to FIG. 1, one embodiment of the invention is herein described as an advertising medium 10 employing a traffic signal control cabinet 12. As generally described, the cabinet 12 comprises a first planar side wall 14 spaced from a second planar side wall 16, with a planar front wall 18 and rear wall 20 extending therebetween. Top and bottom walls 22, 24 add to a rectangular shaped housing 26 having an enclosed storage area 28 formed therein. The cabinet 12 further comprises a door 30 extending over an opening 32 formed in the rear wall 20, by way of non-limiting example, and wherein the top wall 22 extends beyond at least the rear wall 20 to form a flange 34 above the door 30.

As illustrated with reference to FIG. 2, a frame 36 generally encloses the cabinet 12. The frame 36 has opposing rails 38, 40 for each of the side 14, 16, rear 20 and front 18 walls of the cabinet 12. Opposing inside surfaces 42, 44 of the rails 38, 40 include a plurality of grooves 46 extending longitudinally along the rail and spaced from each other, as illustrated with reference to FIG. 3.

Figure 3:
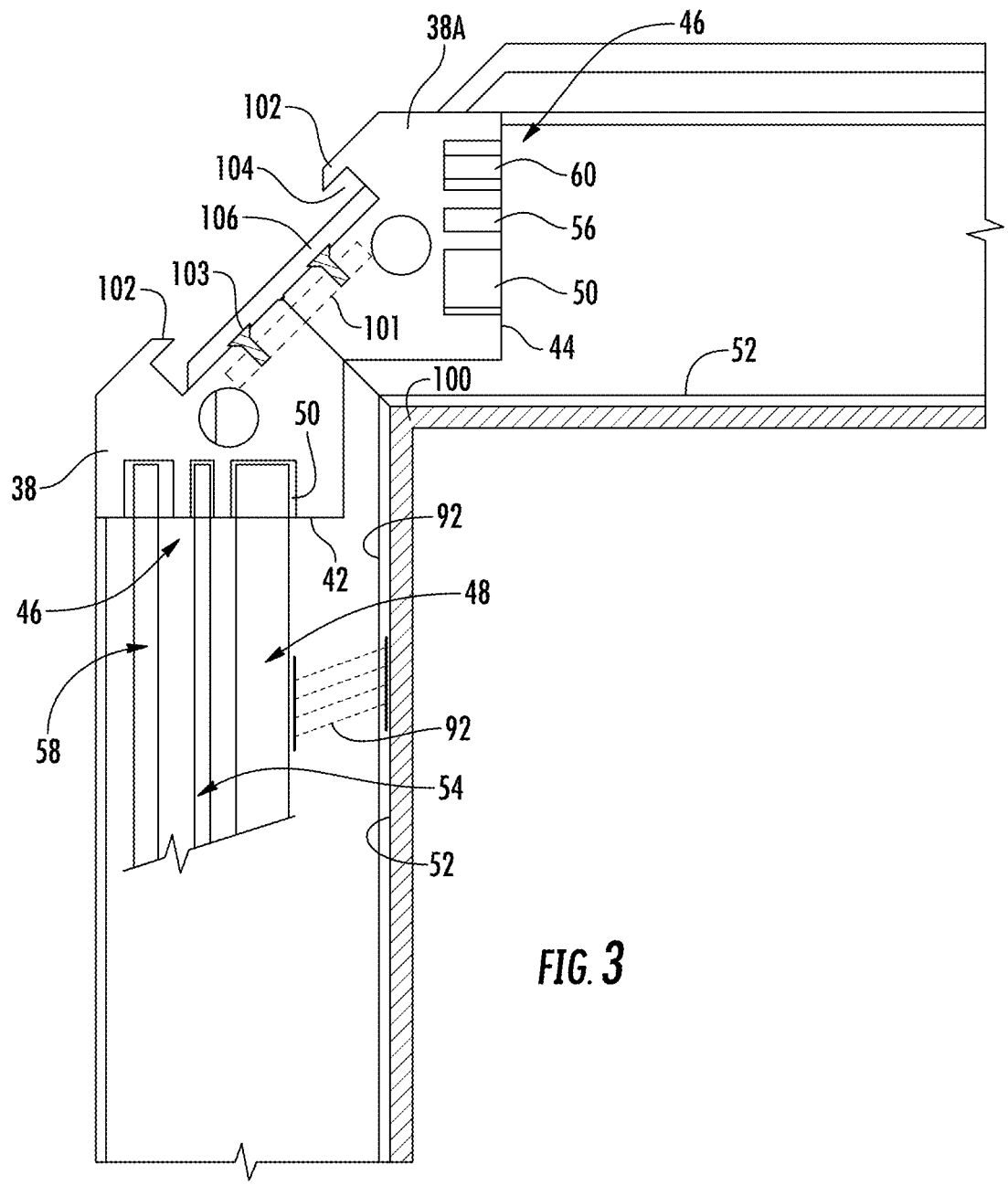
FIG. 3 is a partial cross sectional view illustrating rail portions of the frame of the embodiment of FIG. 1 and use thereof.

As further illustrated with reference to FIG. 3, a light panel 48 is carried within a first groove 50 and spaced from surfaces 52 of the respective walls. An advertising panel 54 is carried within a second groove 56 and spaced from the light panel 48 at a further distance from the cabinet wall surface 52 than the light panel 48. A clear protective panel 58 is carried within a third groove 60 and itself spaced from the advertising panel 54 and further distanced from the cabinet wall surface 52 than the advertising panel 54.

Figure 4:
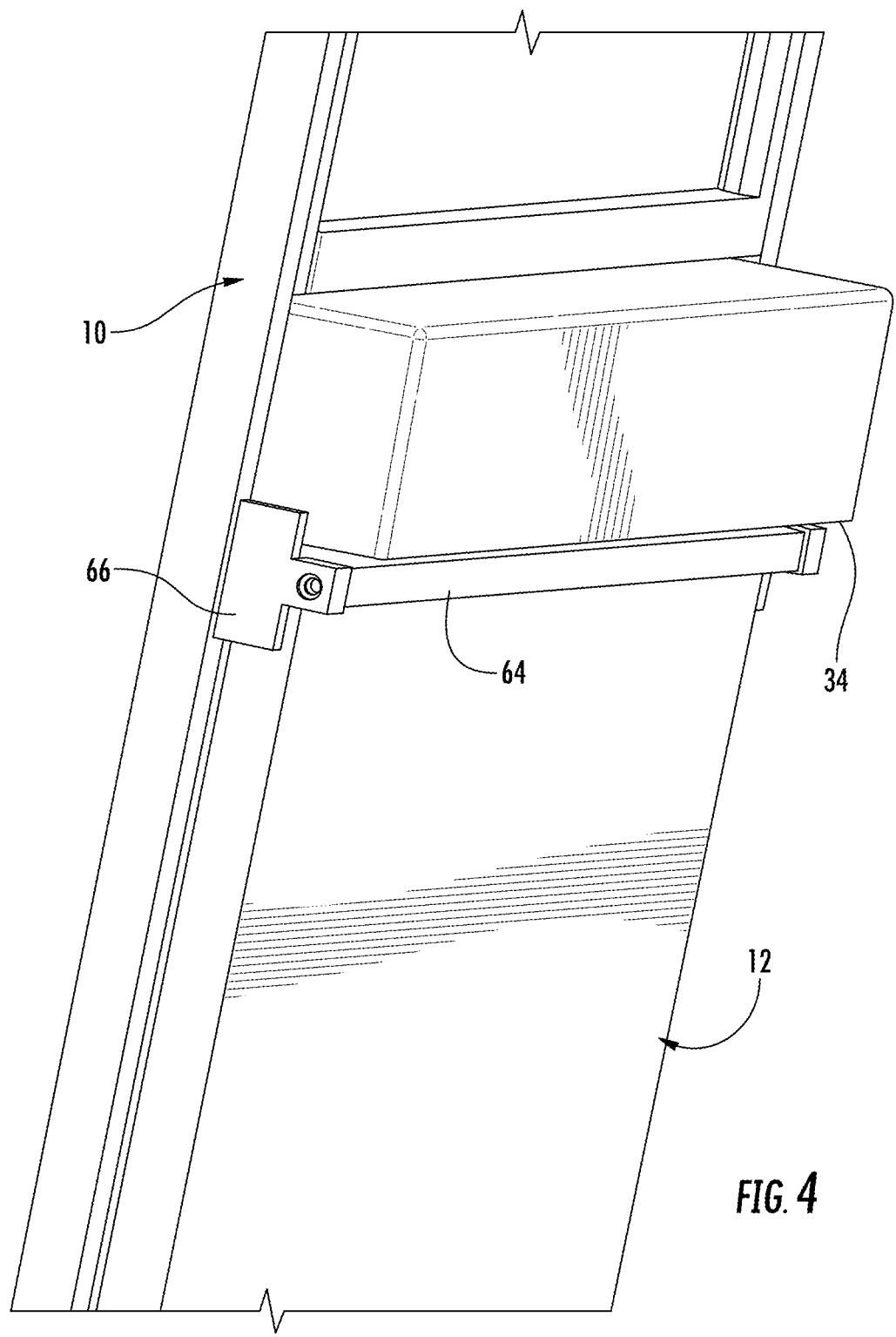
FIG. 4 is a partial perspective view of the embodiment of FIG. 1 illustrating a locking assembly portion according to the teachings of the present invention.
Figure 5:
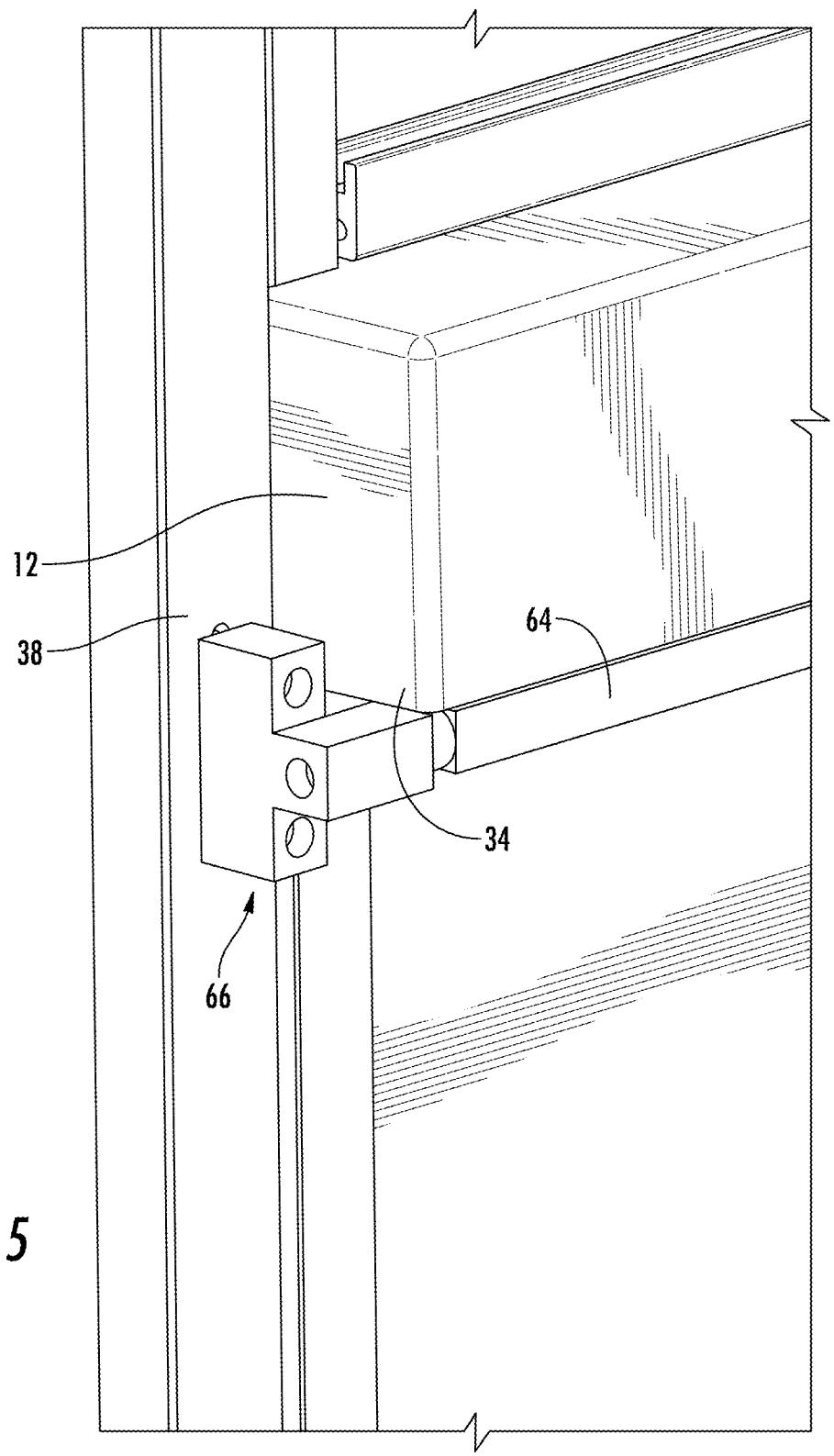
FIG. 5 is a closer perspective view of the embodiment illustrated in FIG. 4 further illustrating a lock device used therewith.

As illustrated with reference again to FIGS. 1 and 2, and now to FIGS. 4 and 5, a first locking assembly 62 includes a first tie rod 64 extending between opposing rails 38, 40 proximate the rear wall 20 and under the flange 34. A lock device 66 is affixed to free ends 68, 70 of the first tie rod 64. The lock device 66 is secured to the opposing rails 38, 40 proximate the rear wall 20 and under the flange 34 such that a vertical lifting of the frame 36 is limited by interaction of the first tie rod 64 with the flange.

Figure 2:
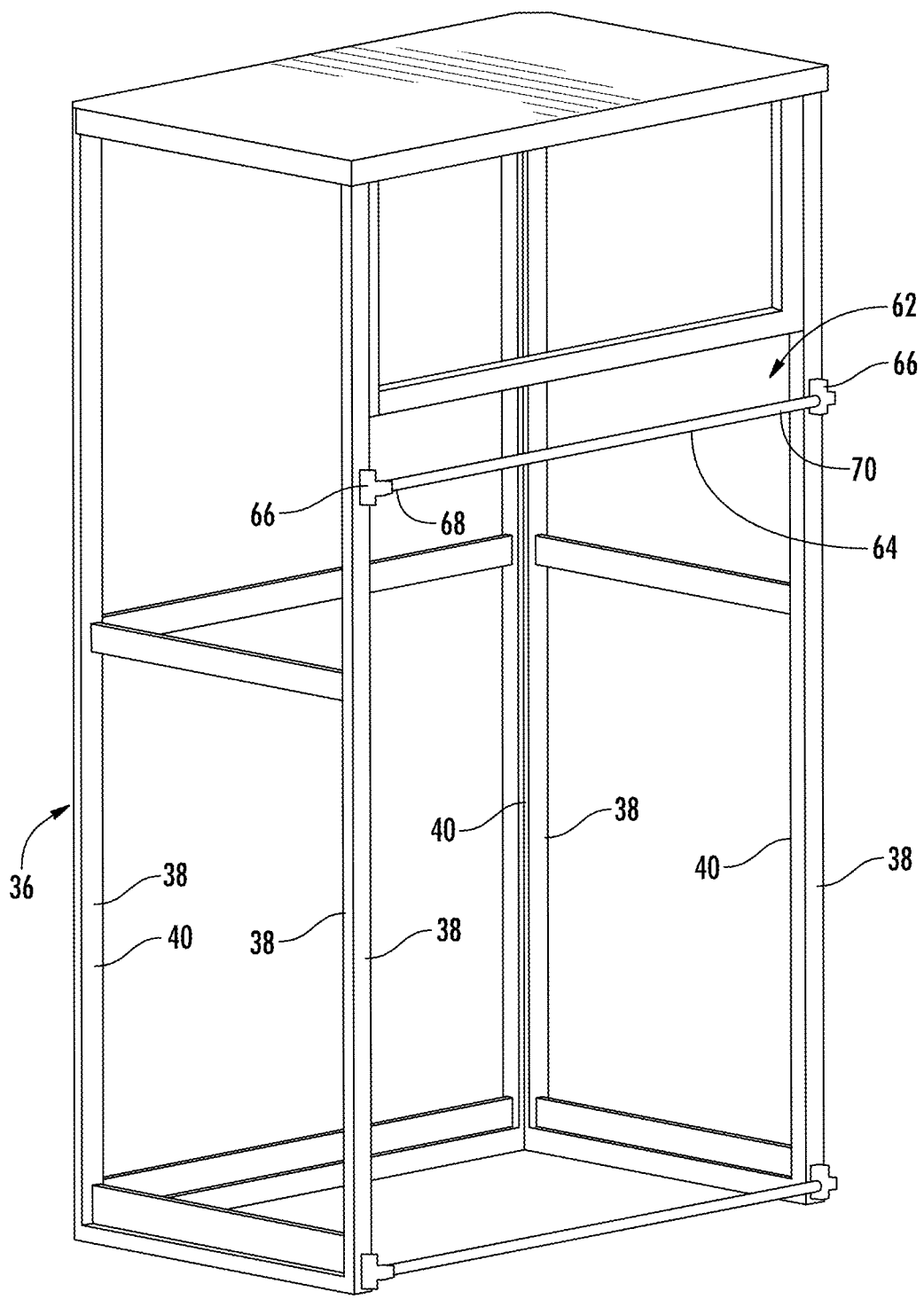
FIG. 2 is a perspective view of a frame assembly of the embodiment of FIG. 1 illustrating selected elements thereof, by way of non-limiting example.
Figure 6:
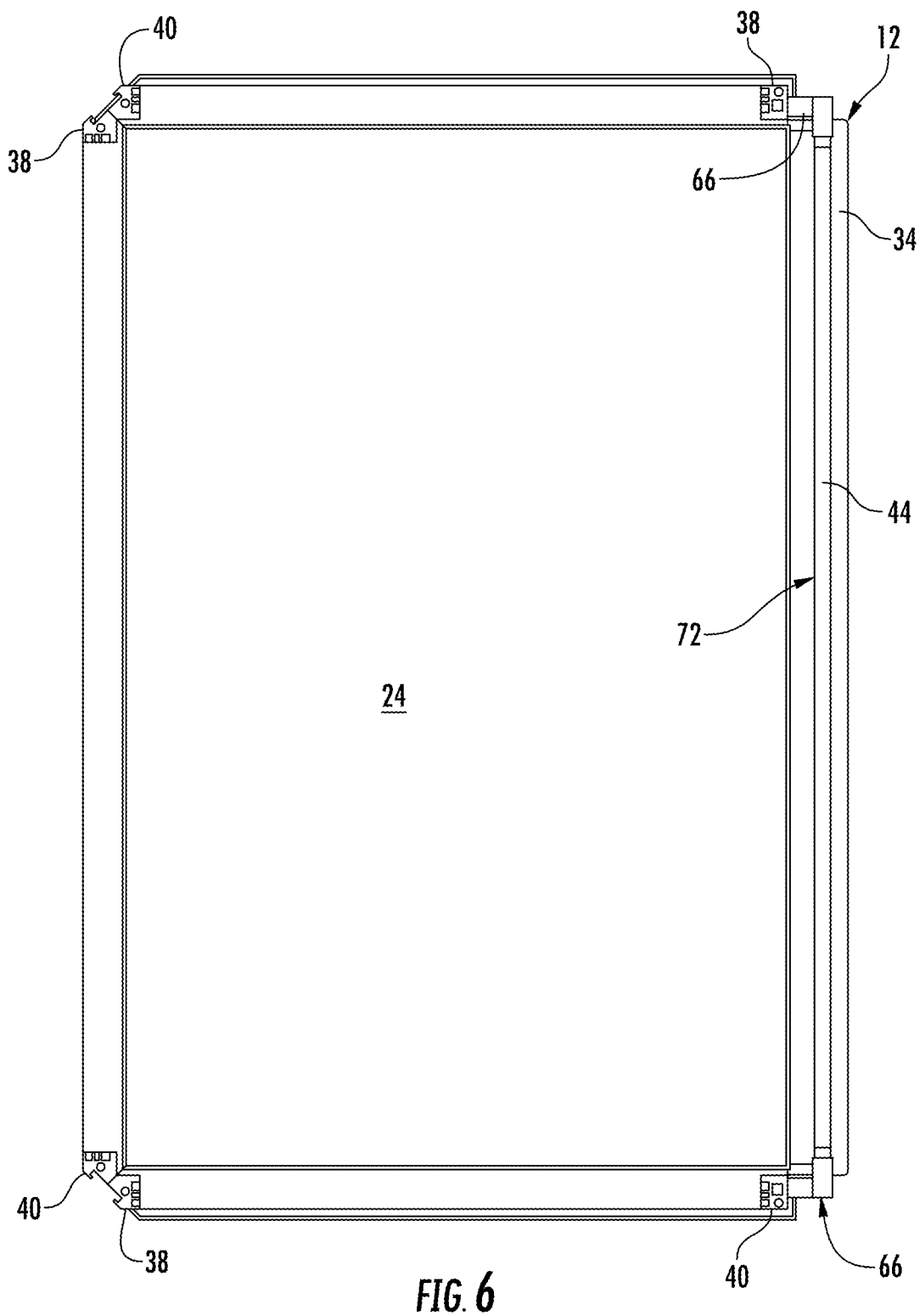
FIG. 6 is a bottom view of the embodiment of FIG. 1.

With continued reference to FIGS. 1 and 2 and to FIG. 6, a second locking assembly 72 includes a second tie rod 74 extending between the opposing rails 38, 40 proximate the rear wall 20 and at a lower portion 76 of the rear wall 20 sufficient for permitting access into the cabinet housing 26 through the opening 32 when the door 30 is in an opened position. The lock device 66, as above described, is affixed to each of opposing ends of the second tie rod 74 with the lock device secured to the opposing rails 38, 40 with the second tie rod 74 held proximate the rear wall 20.

As illustrated with reference to FIG. 7, one embodiment of the lock device 66, herein described by way of example, comprises a body 78 having a first leg 80 including a first bore 82 extending longitudinally therein. The first bore 82 receives the free end 68, 70 of the tie rods 64, 74, wherein a first bolt 84 extends into the first bore 82 to secure the tie rod to the body 78. A second leg 86 extends generally perpendicular to the first leg 80. The second leg 86 includes a second bore 88, herein two second bores illustrated by way of example, extending through the second leg. A second bolt 90 extends through the second bore 88 into the rail 38, 40 and secures the body 78 to the rail, thus securing the lock device 66 to the rails.

Figure 7:
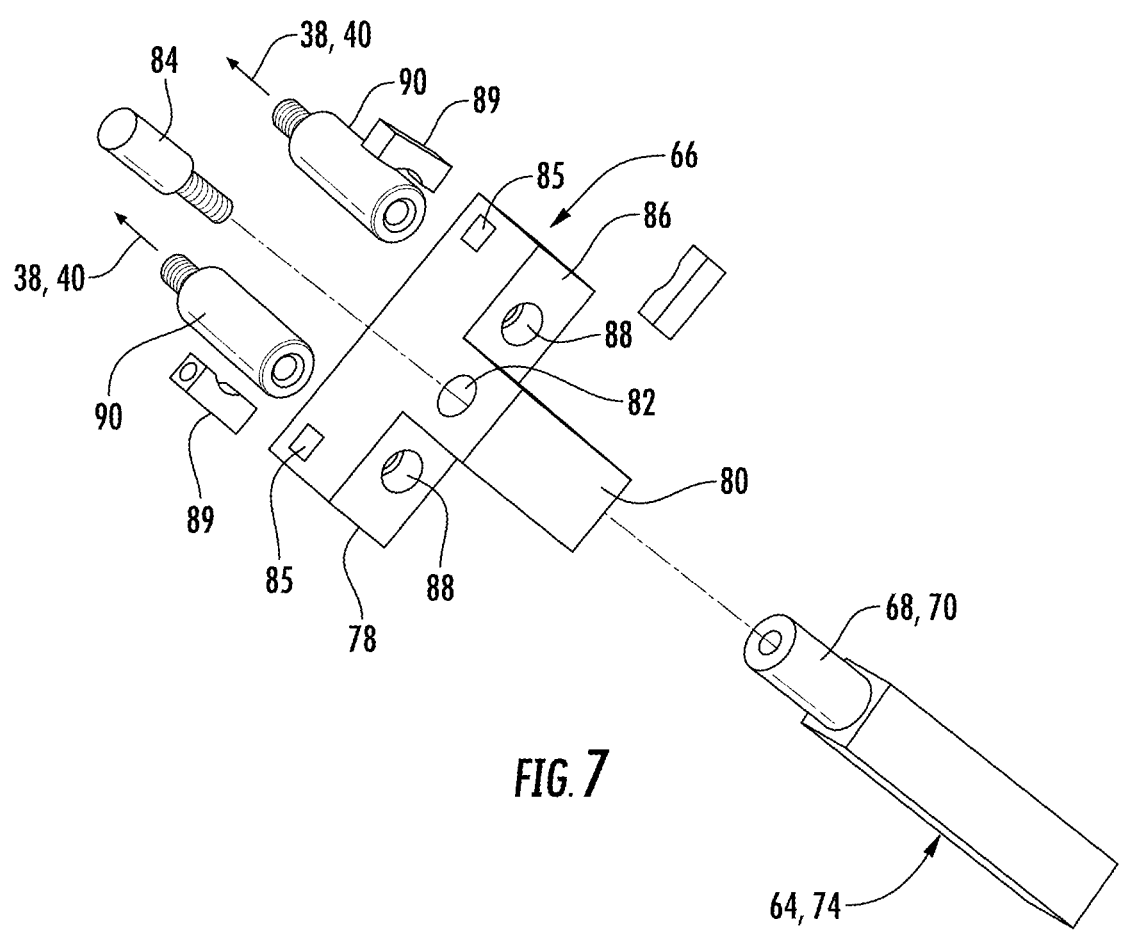
FIG. 7 is an exploded perspective view of the lock device of FIG. 5.

With continued reference to FIG. 7, the second leg 86 includes a third bore 85 extending therein proximate the second bore 80 and generally perpendicular to an axis thereof, the lock device 66 including a key 89 extending into the third bore 85 mating with the second bolt 90 for fixing the second bolt within the second bore and preventing movement thereof.

With reference again to FIG. 3, a foam pad or sheet 92 may be sandwiched between at least some of the side wall surfaces 52 of the cabinet housing 26 and respective light panels 48. The foam pads may optionally have a thickness for sufficiently preventing damage to the wall surfaces 52 and sufficiently thick to contact both the wall surface 52 and the light panel 48, as desired.

With reference again to FIGS. 1 and 2, a top cover panel 94 is secured to the plurality of rails 38, 40 thus contributing to the forming of the frame 36, wherein the rails, and thus the frame extends beyond the top wall 22 of the cabinet 12 for providing a utility storage area 96 between at least a portion of the top wall of the cabinet and the top cover panel. Electronic and other equipment, such as batteries, may be securely stored within the utility storage area 96.

With reference again to FIG. 3, adjacent rails 38, 38A of the frame 36 located at corners 100 of the cabinet 12 are secured together, using bands 101 and screws 103, by way of example. The mirror image shape of each rail 38, 38A is such that tabs 102 On each rail combine to form a slot 104 longitudinally extending along the adjacent rails 38, 38A, by way of example. A ribbon cover 106 extends in the slot and limits access to the screws 103, by way of further example.

Figure 8:
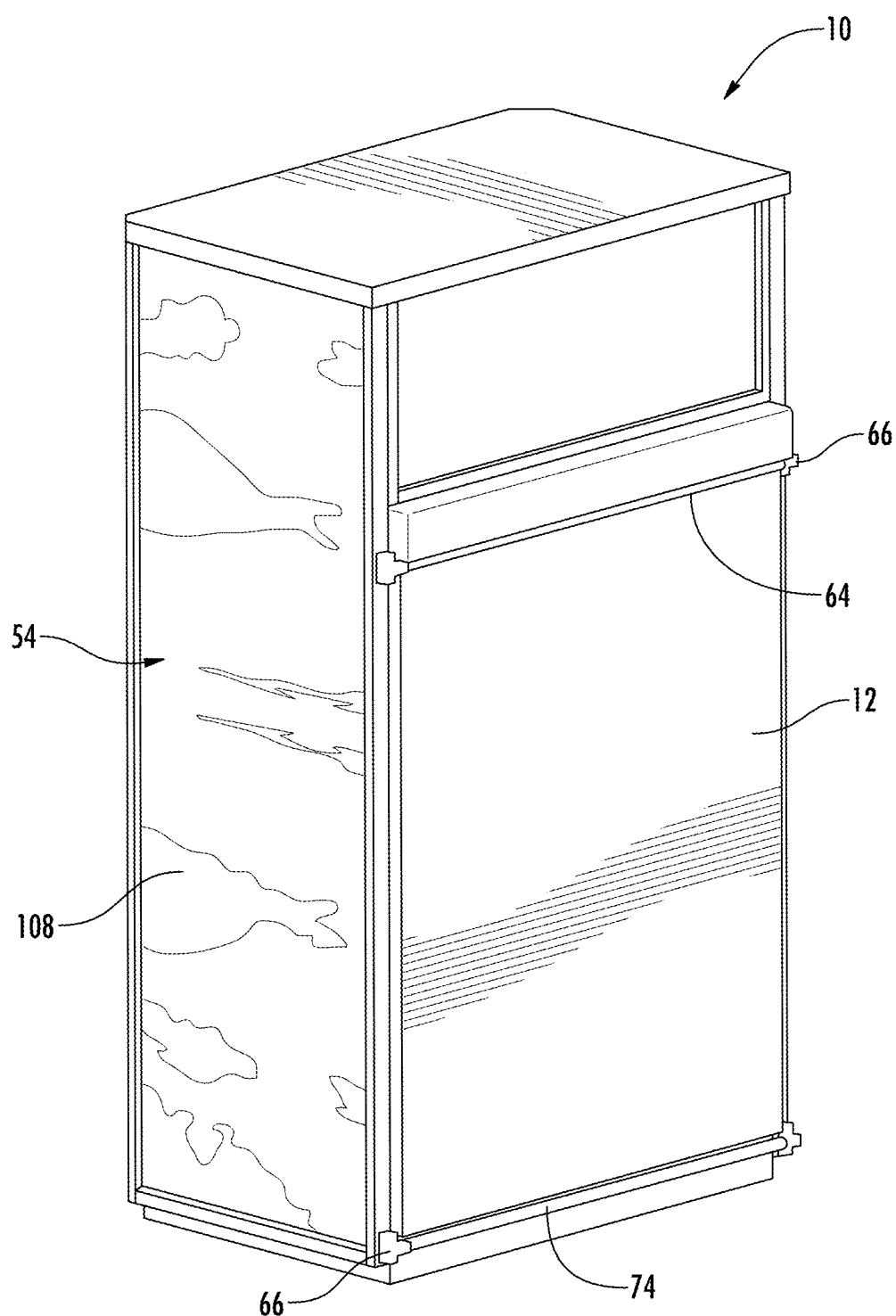
FIG. 8 is a front left perspective view of the embodiment of the present invention, herein described by way of example only, illustrating advertising medium displayed from the traffic signal control cabinet.
Figure 9:
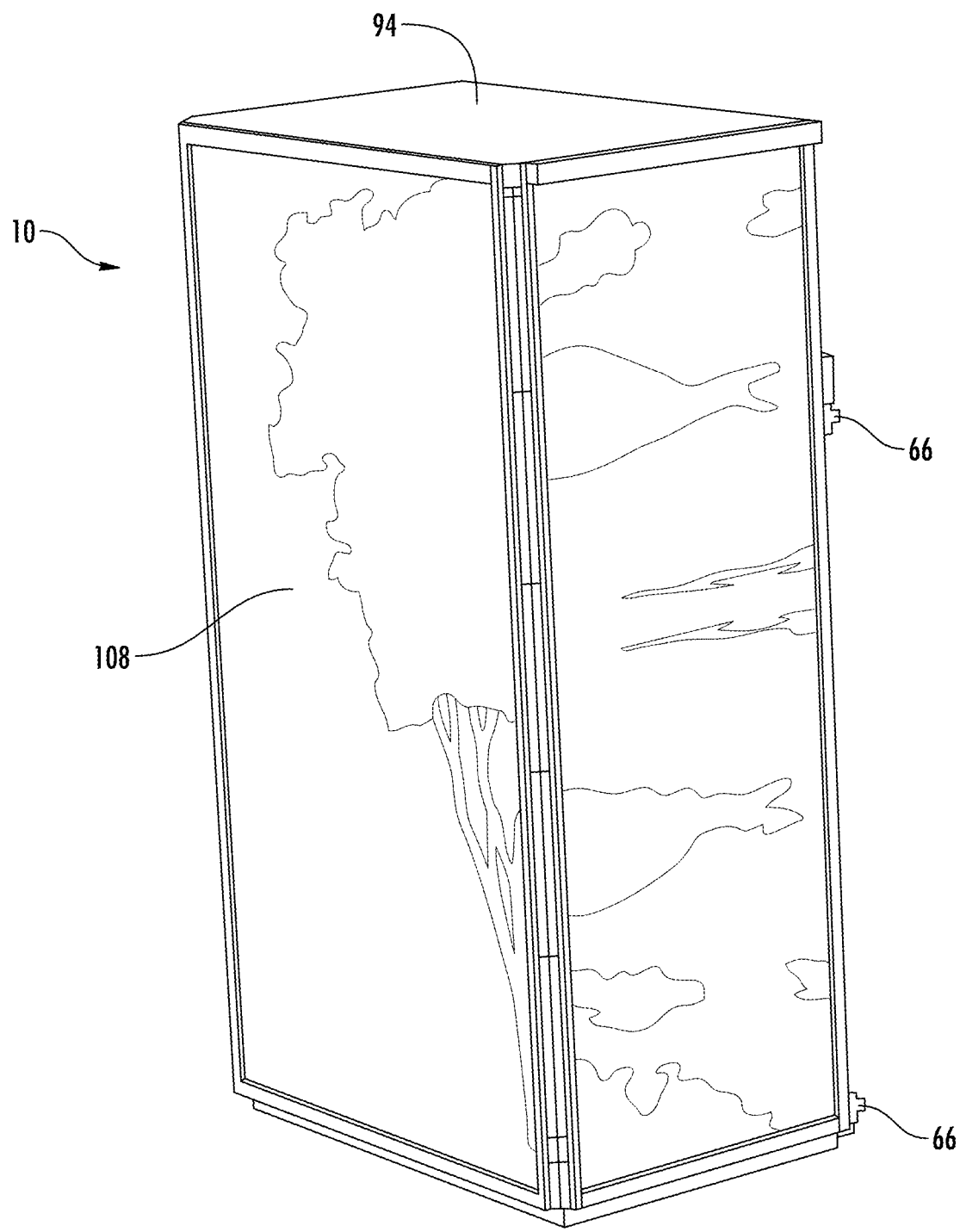
FIG. 9 is a rear right perspective view of the embodiment of FIG. 8.

As illustrated with reference to FIGS. 8 and 9, it will come to the mind of those skilled in the art that commercial and environmental promotions indicia/images 108 may be attractively displayed from what is typically a bland box. Such use can further benefit the government entities responsible for traffic signal control cabinets by providing desired revenue while maintaining the integrity of the traffic signal control.

Alternative Embodiment

With reference initially to FIGS. 10 through 14, one embodiment of the invention is herein described as an advertising medium 210 employing a traffic signal control cabinet 212. As generally described, the cabinet 212 comprises a first side wall 214 spaced from a second side wall 216, with a front wall 218 and rear wall 220 extending therebetween. Top and bottom walls 222, 224 complete a rectangular shaped housing having an enclosed storage area 228 therein. In one embodiment, at least one of the front wall 218 and the rear wall 220 is defined by and/or comprises a door for accessing the enclosed storage area 228. In one exemplary embodiment, the top wall 222 extends beyond at least one of the front wall 218 and the rear wall 220 to form a flange 234 above the door, which extends outward from the cabinet 212. A graphic 300 can be placed generally on or within an advertising panel 254, but may alternatively be placed anywhere on the advertising medium 210 and/or cabinet 212. In one embodiment, the advertising medium 210 comprises rails 238, 240, 242, 244 generally conforming to the shape of the underlying cabinet 212 and aligned with the peripheral corners thereof. The rails may be further secured to one another with a plurality of secondary rails 246. Furthermore, the rails may extend upward beyond the top wall of the cabinet and define a secondary enclosed structure that may be used for additional advertising, storage, or other pertinent use.

Figure 15:
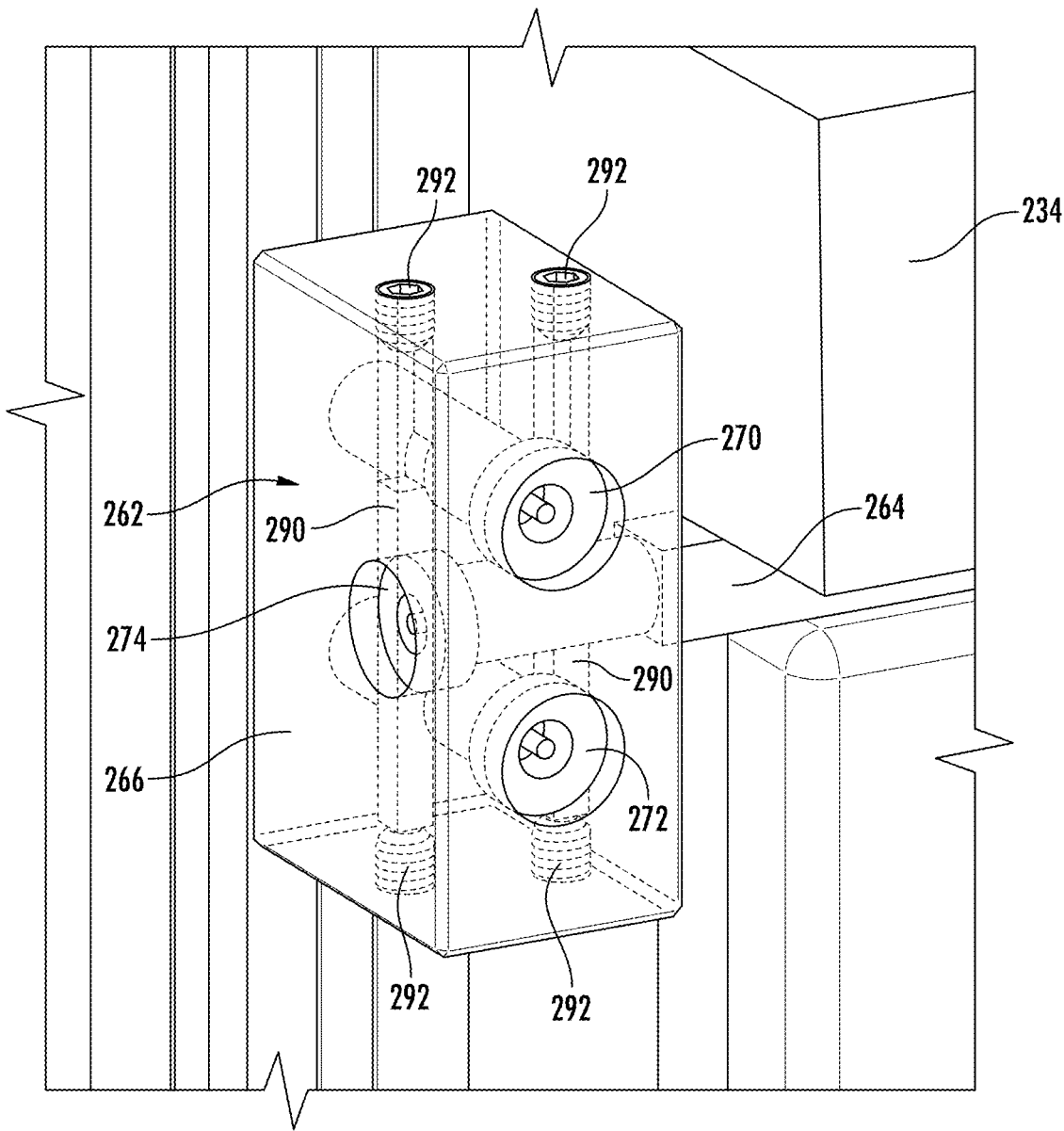
FIG. 15 is a front left perspective view of the locking mechanism of the present invention.
Figure 16:
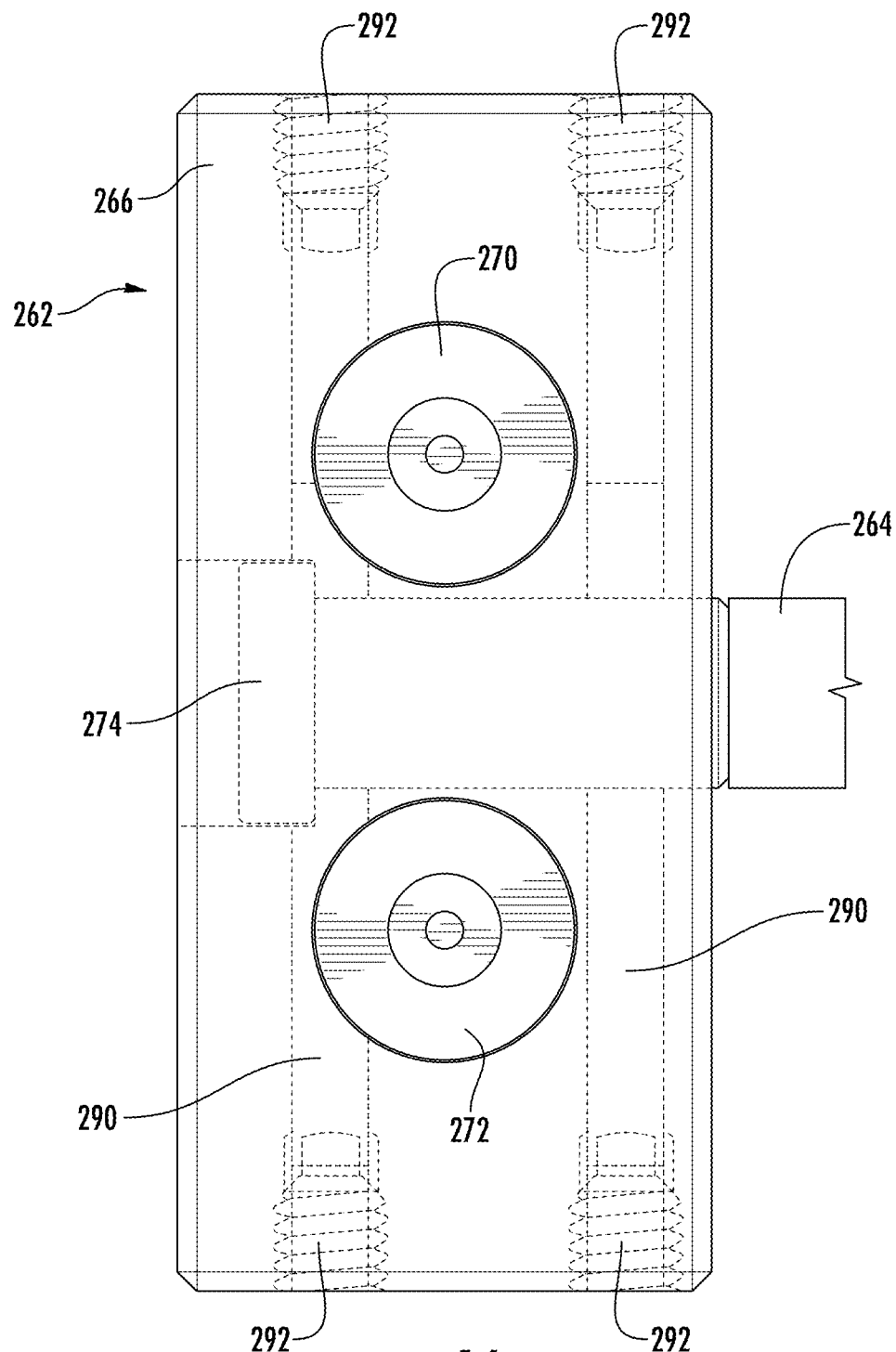
FIG. 16 is a side perspective view of the locking mechanism of FIG. 15.
Figure 17:
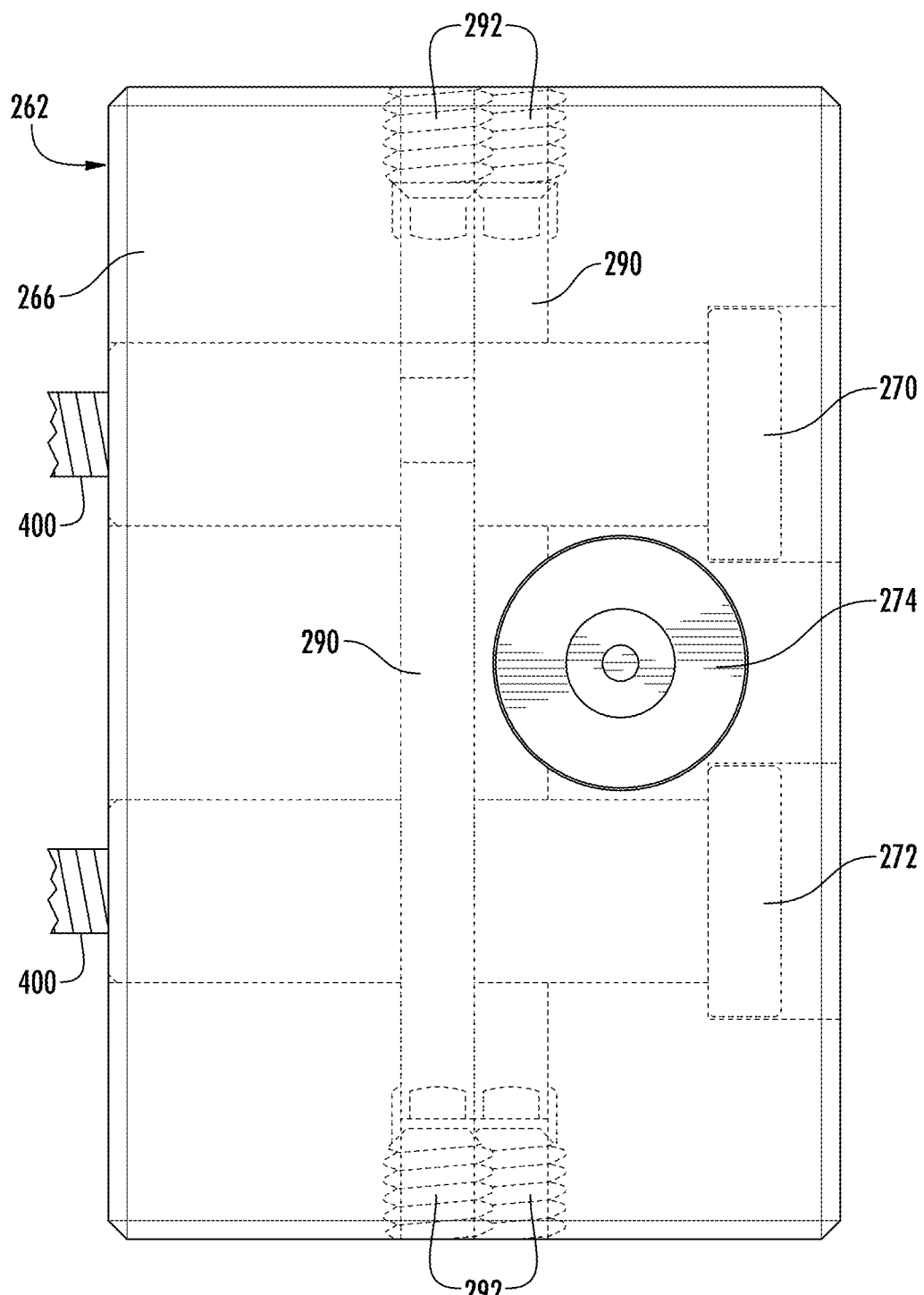
FIG. 17 is a front perspective view of the locking mechanism of FIG. 15.
Figure 18:
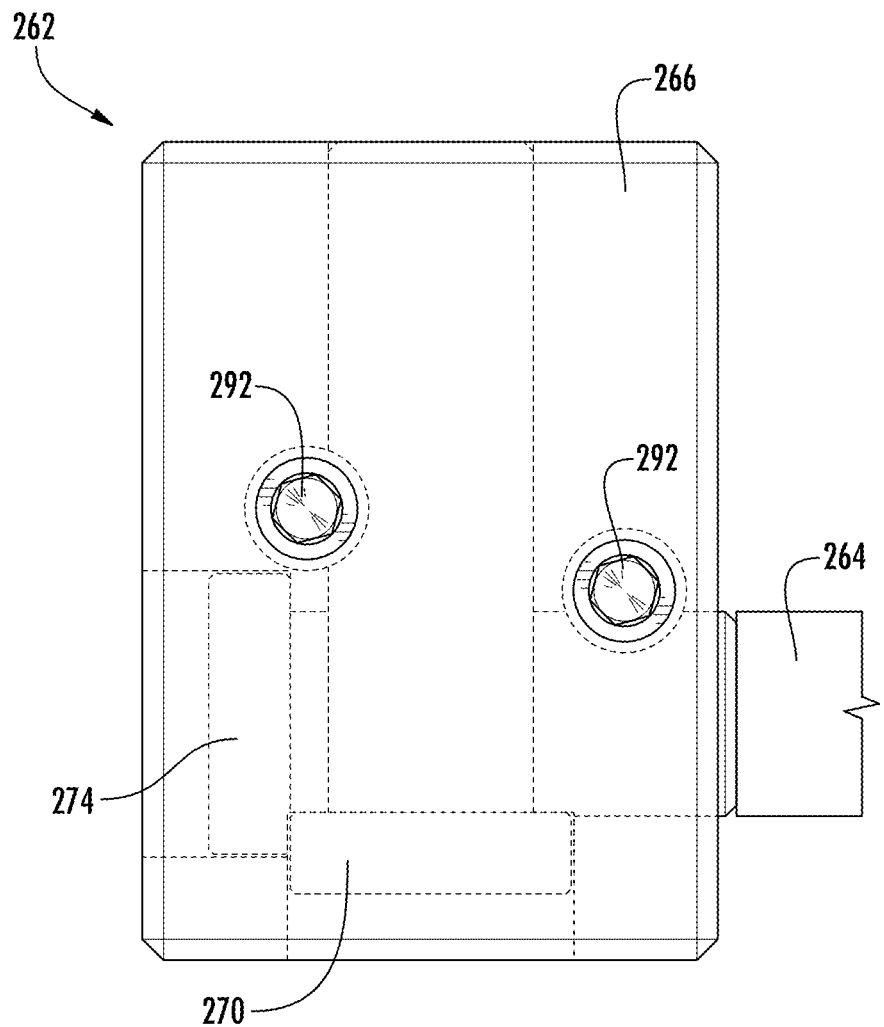
FIG. 18 is a top perspective view of the locking mechanism of FIG. 15.
Figure 19:
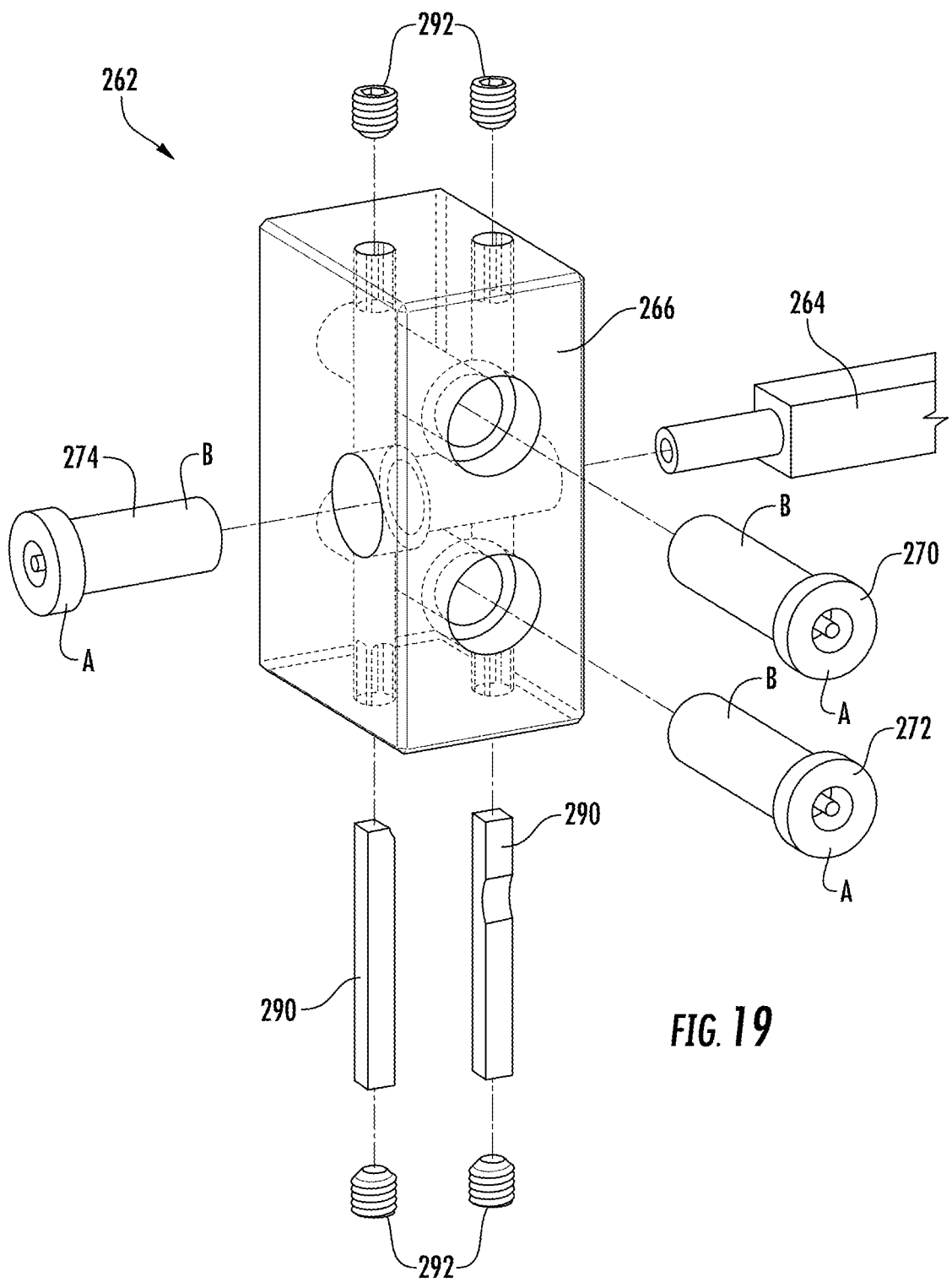
FIG. 19 is an exploded view of the locking mechanism of FIG. 15.
Figure 20:
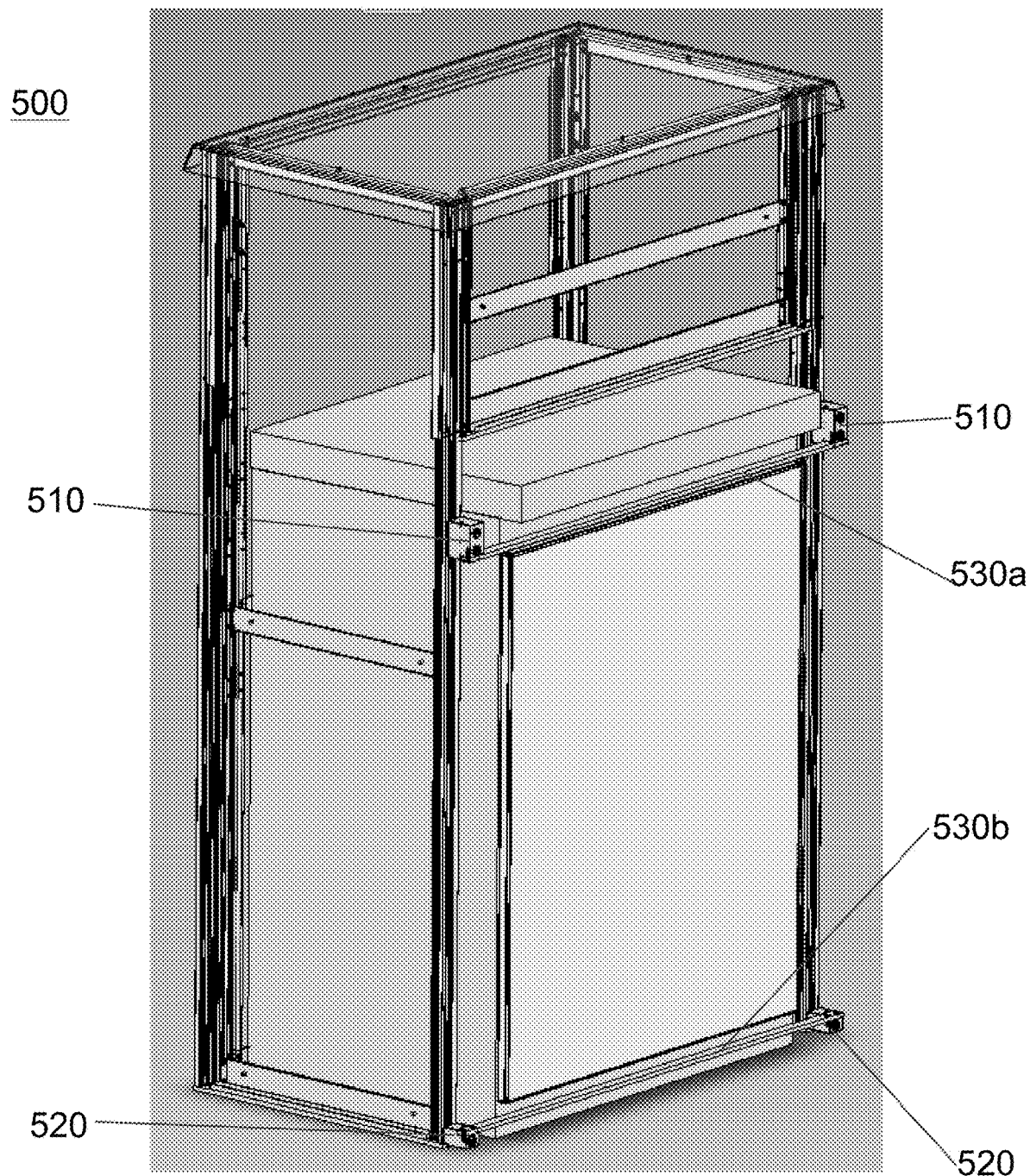
FIG. 20 is an alternative embodiment of the present disclosure wherein differing locking assemblies are used to secure a tie rod therebetween.
Figure 21:
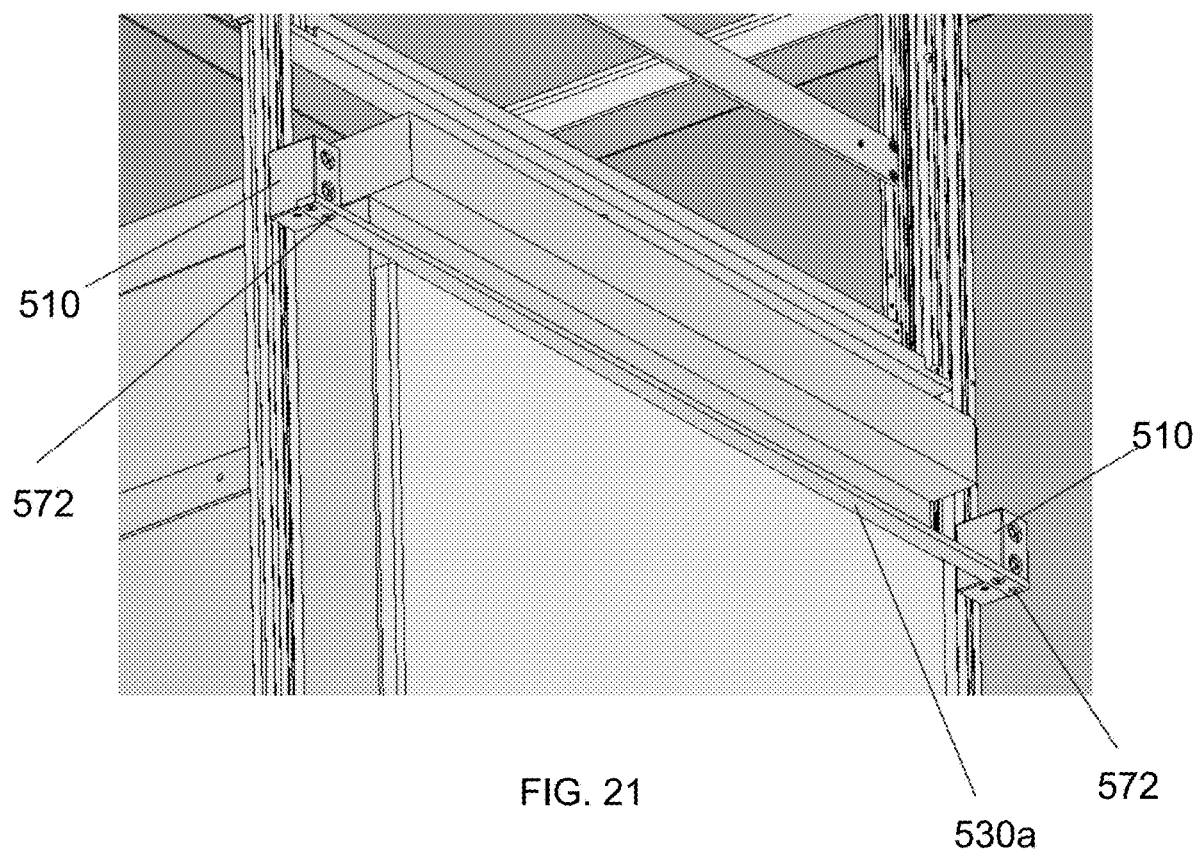
FIG. 21 is a perspective view of an embodiment of a locking assembly used to secure an upper tie rod below a flange extending from a cabinet.
Figure 22:
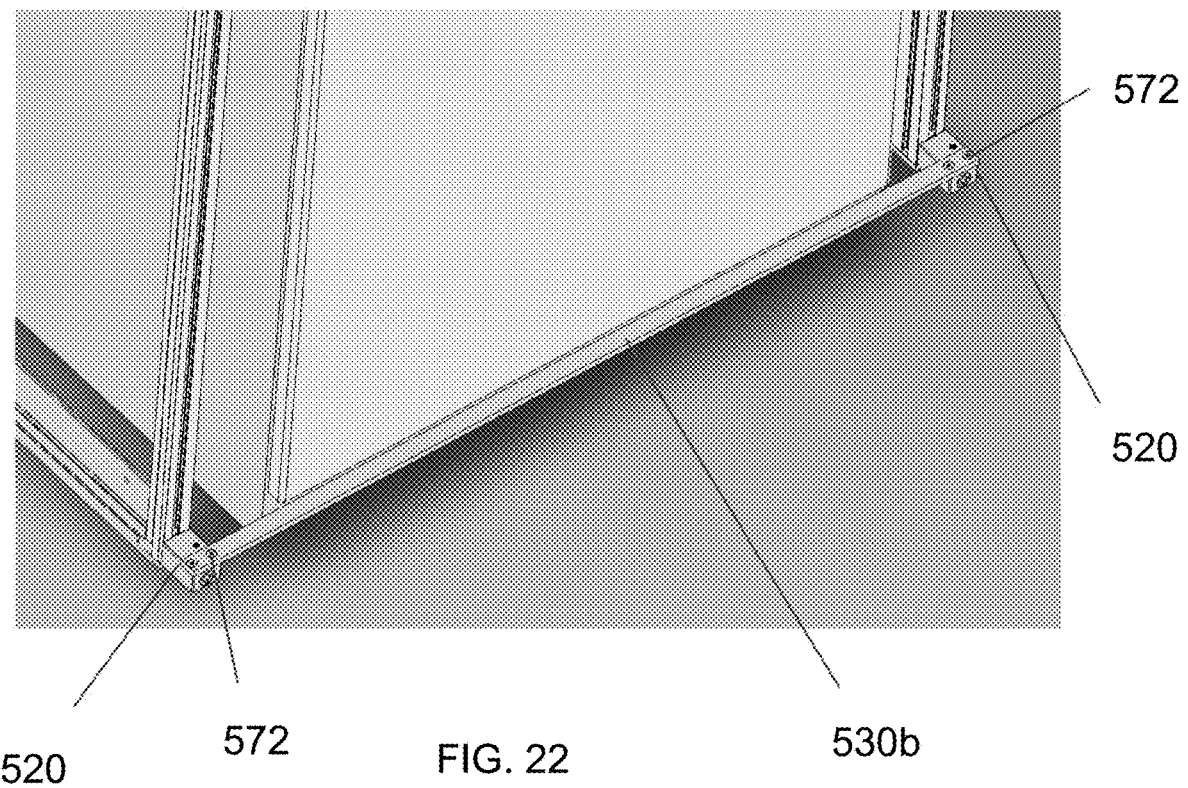
FIG. 22 perspective view of an embodiment of a locking assembly used to secure a lower tie rod beneath a door of a cabinet.
Figure 23:
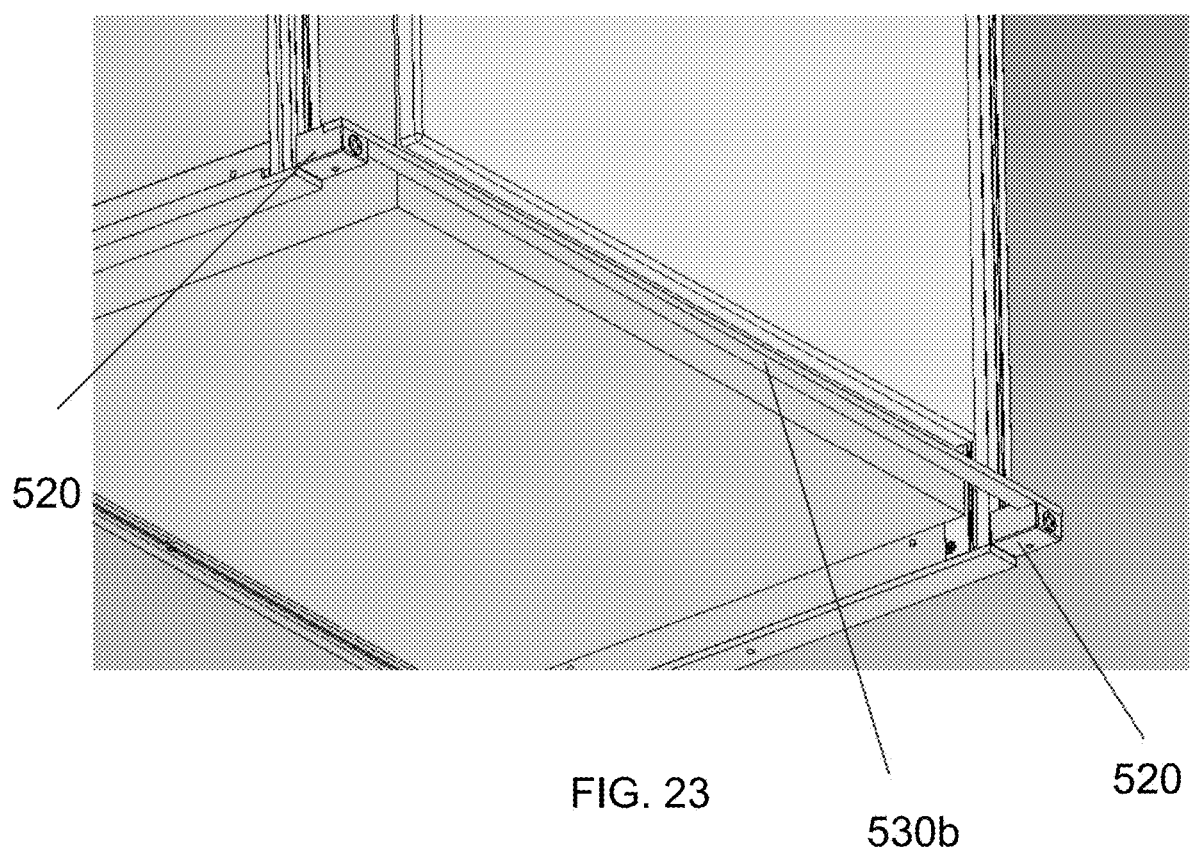
FIG. 23 is a another perspective view of the embodiment of FIG. 22.
Figure 24A:
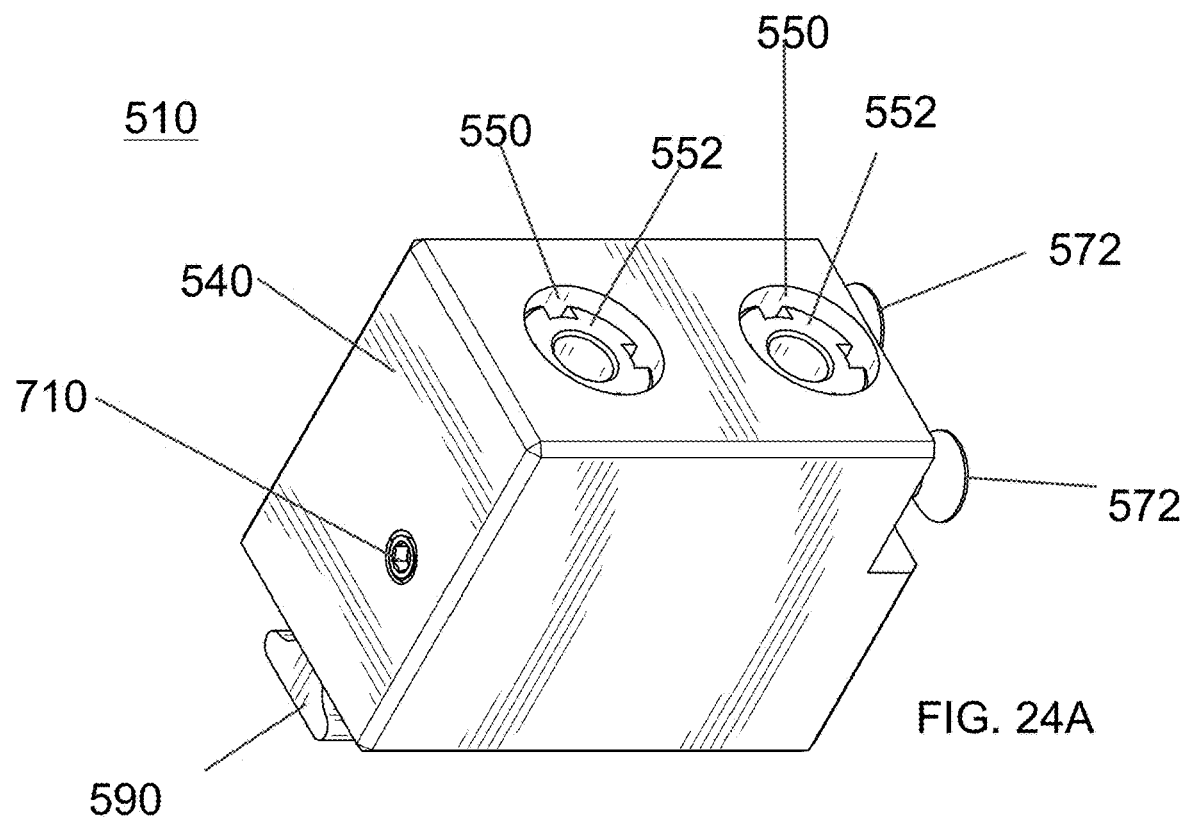
FIGS. 24A and 24B are perspective views of an exemplary locking assembly of the present disclosure.
Figure 24B:
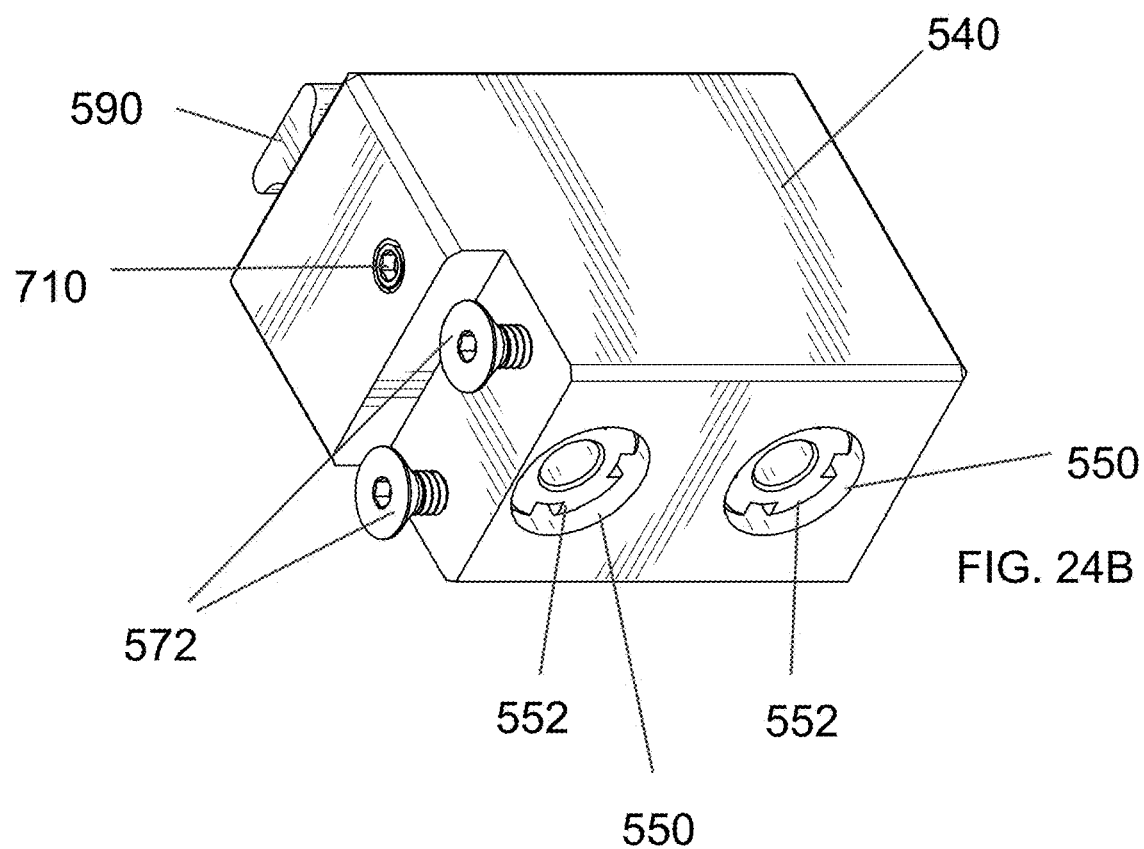
Figure 26:
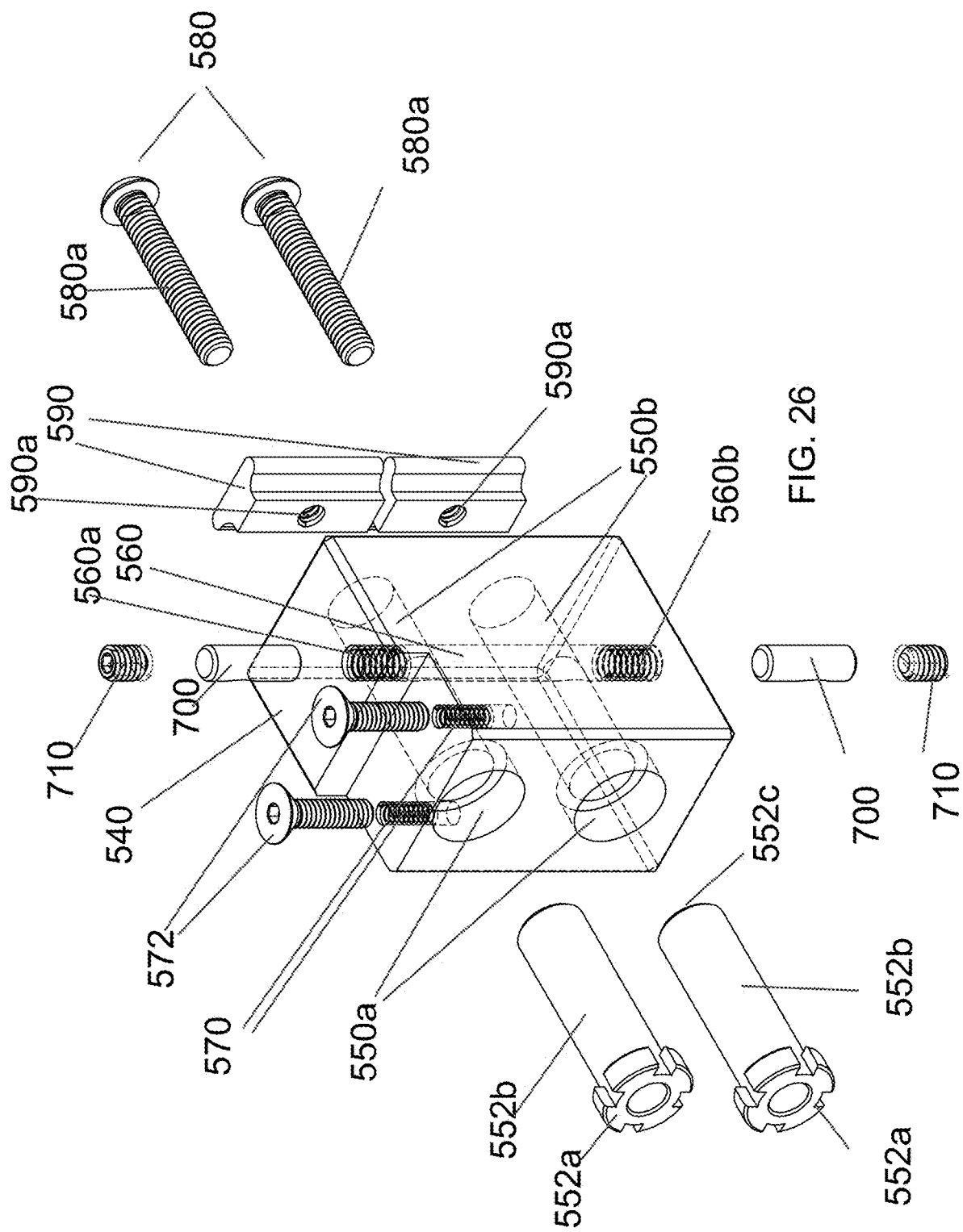
FIG. 26 is another exploded view of the embodiment depicted in FIGS. 24A and 24B.
Figure 27A:
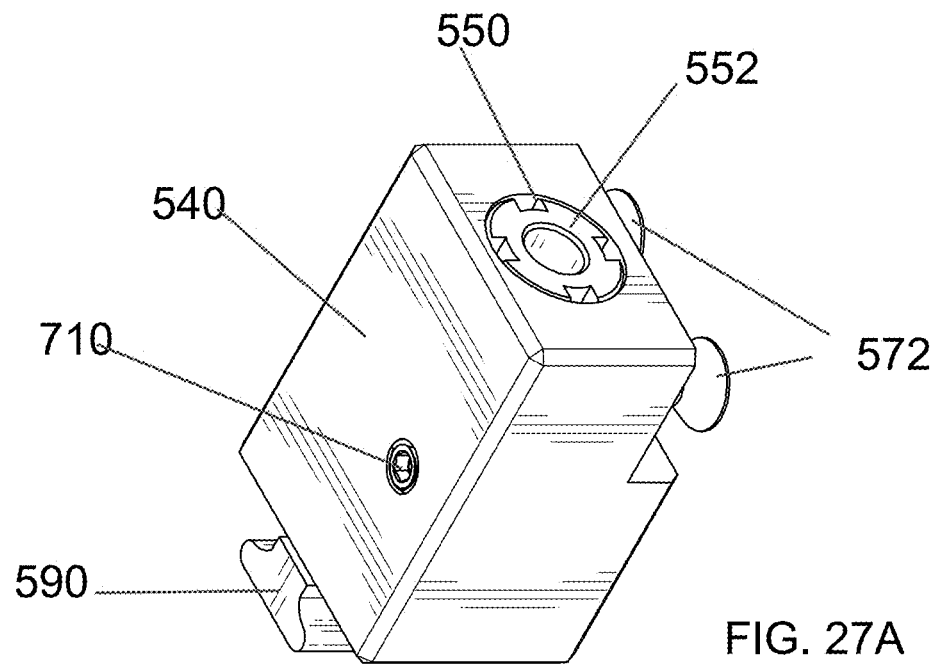
FIGS. 27A and 27B are perspective views of an exemplary locking assembly of the present disclosure.
Figure 27B:
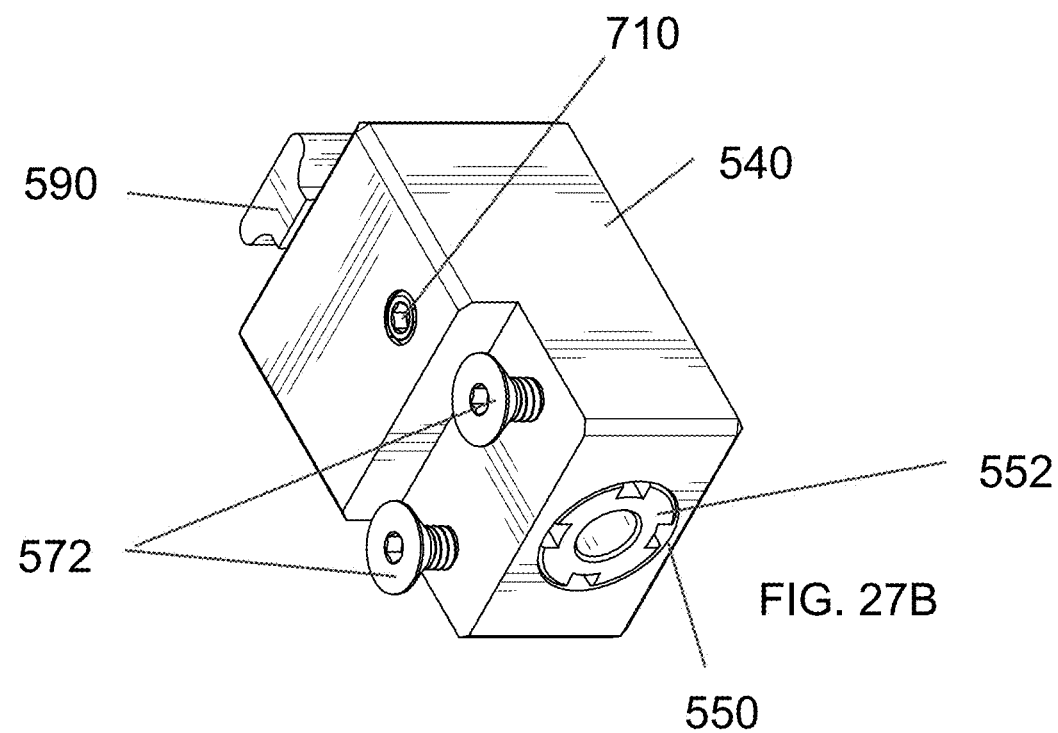
Figure 28:
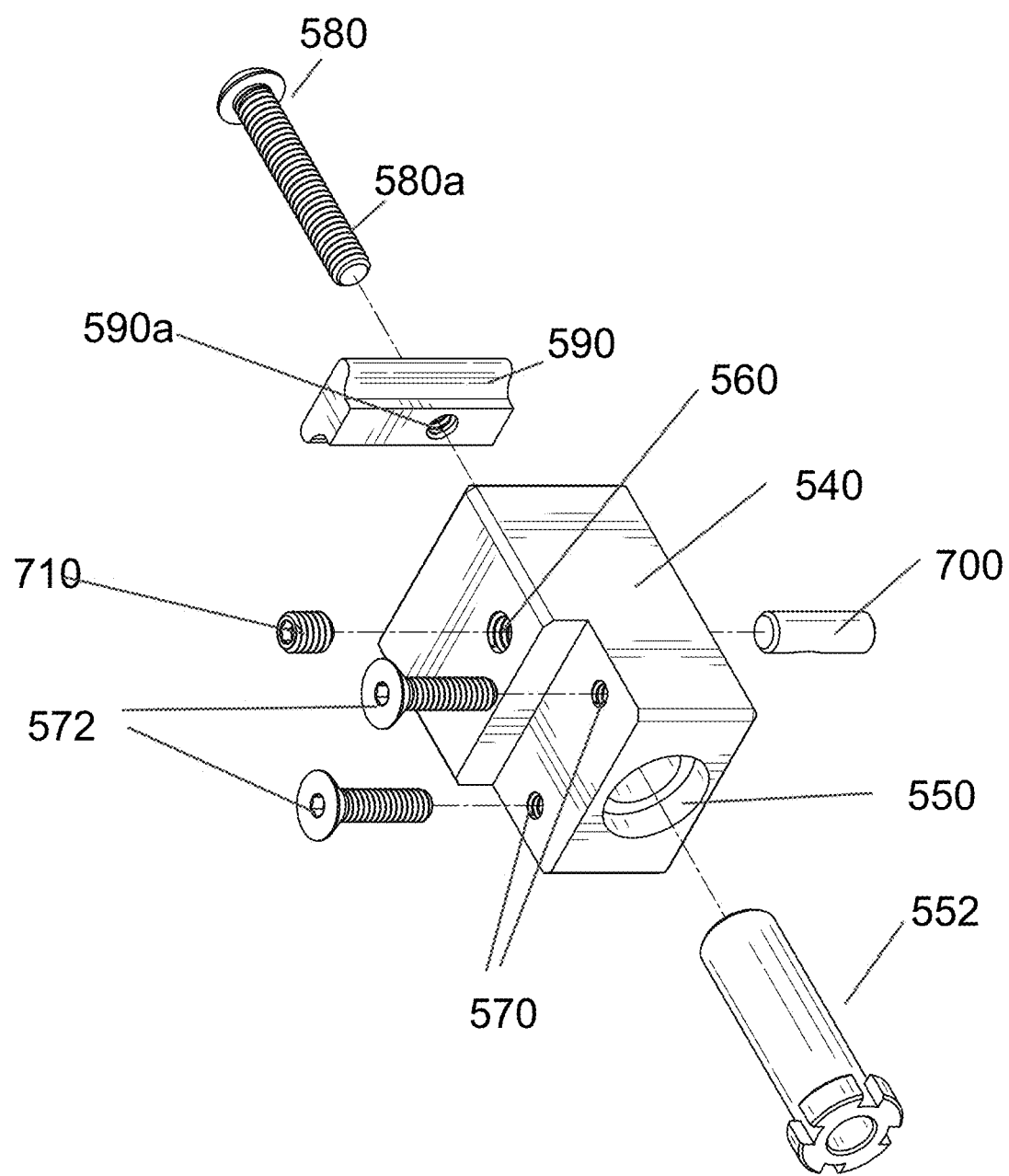
FIG. 28 is an exploded view of the embodiment depicted in FIGS. 27A and 27B.
Figure 29:
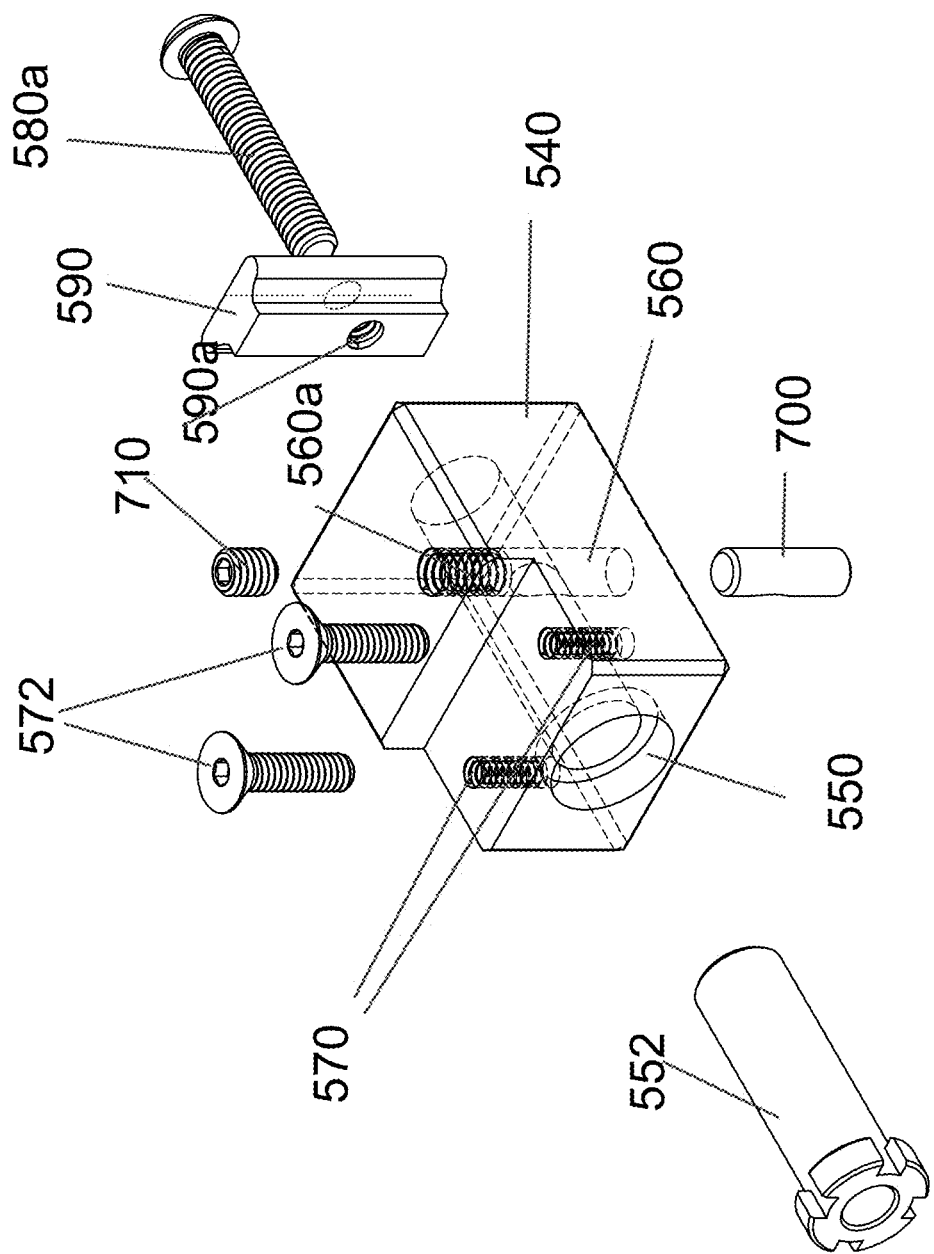
FIG. 29 is another exploded view of the embodiment depicted in FIGS. 27A and 27B.
Figure 30:
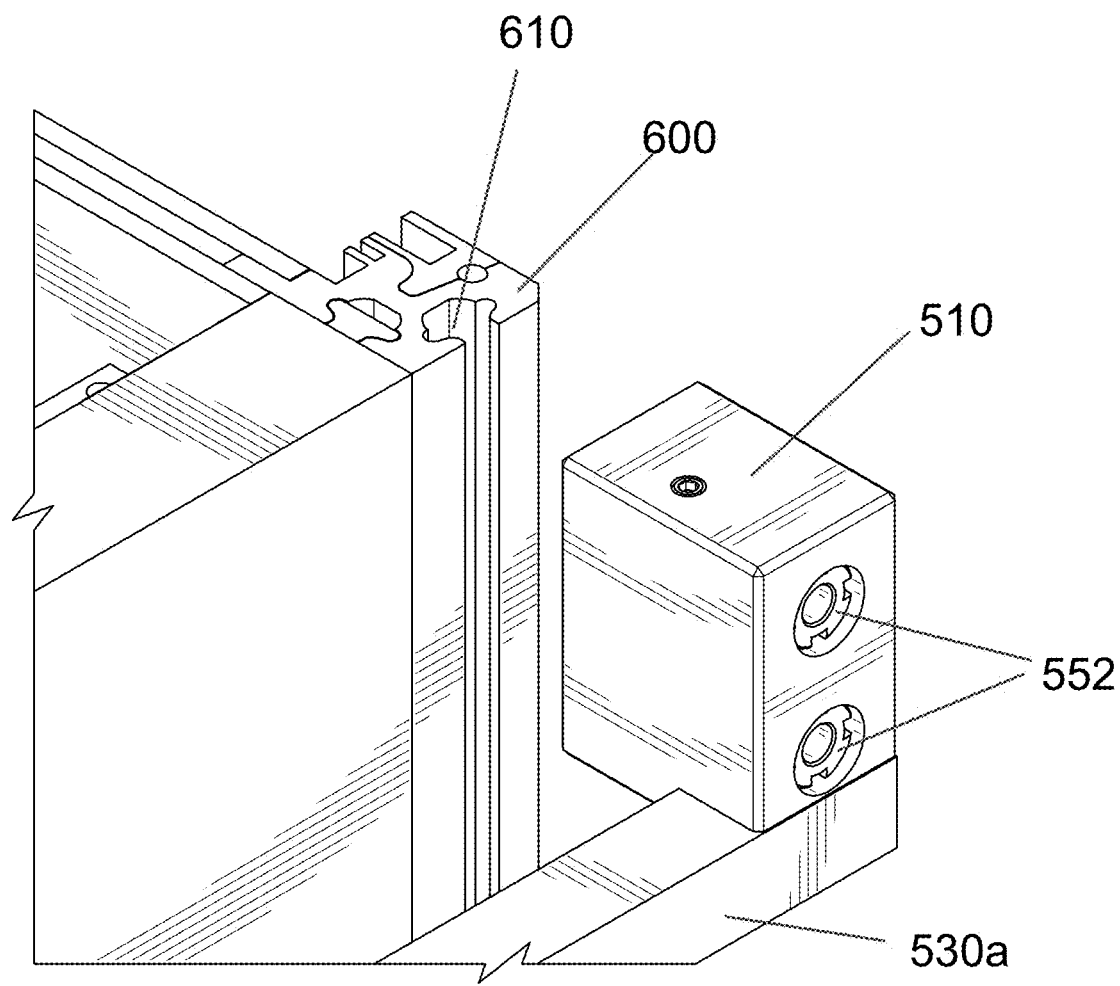
FIGS. 30 and 31 depict an embodiment of a locking assembly and tie rod detached from the frame.
Figure 31:
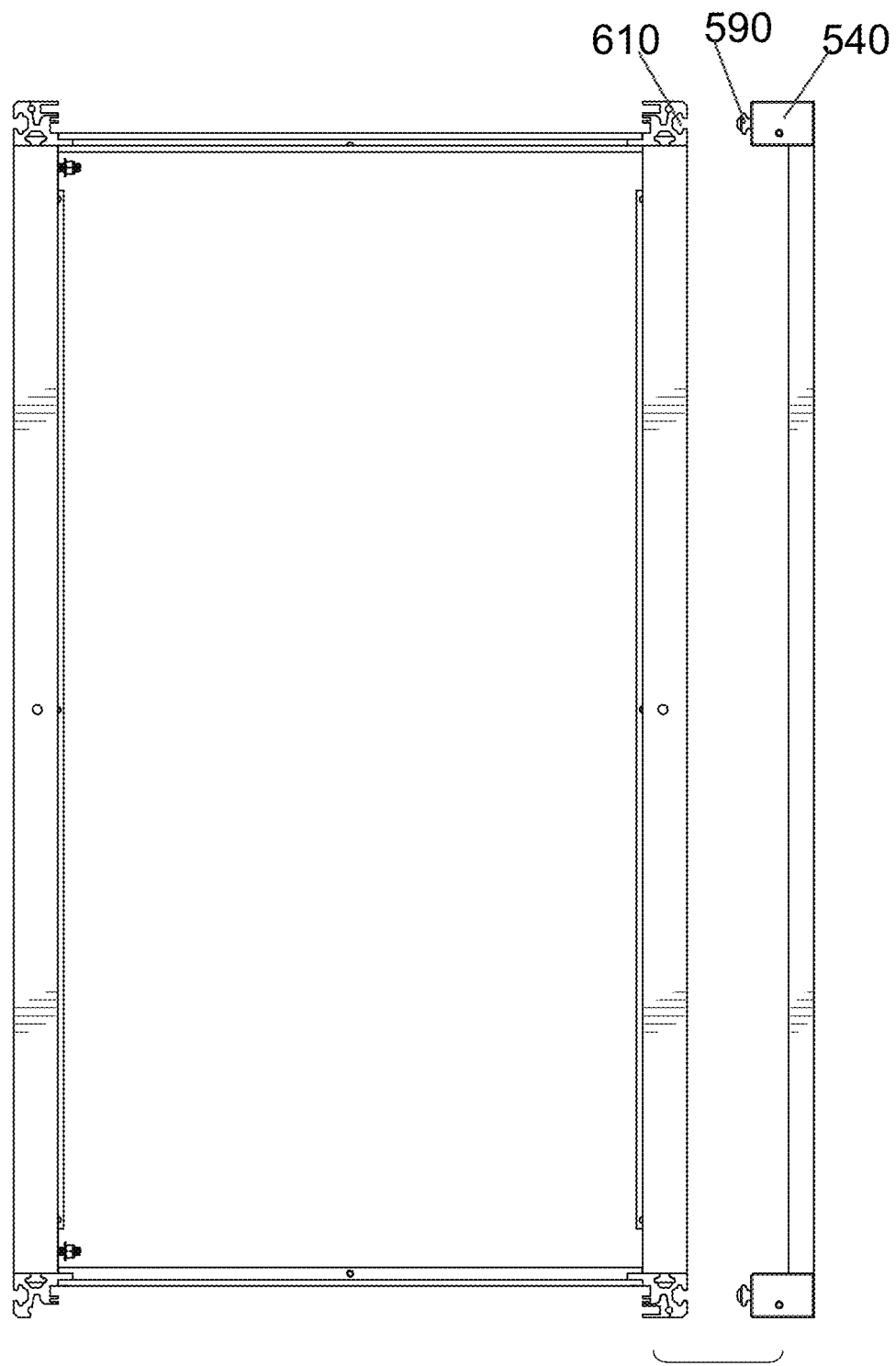
Figure 32:
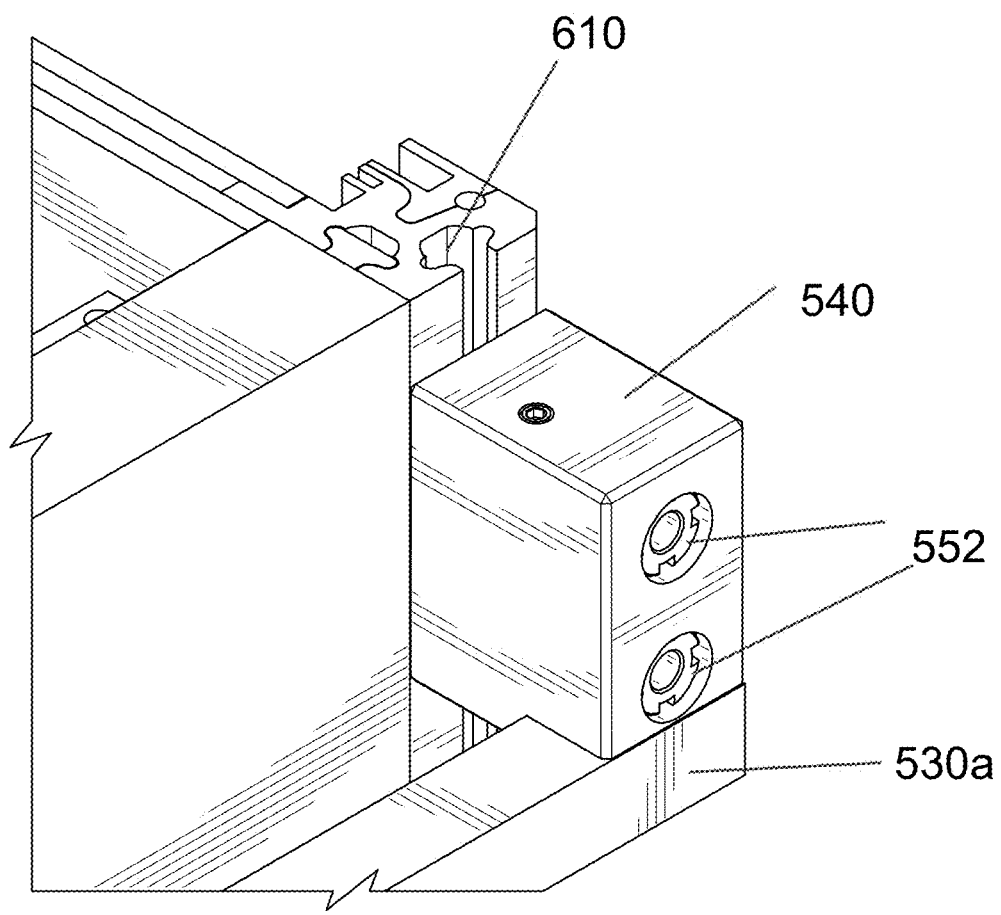
FIGS. 32 and 33 depict an embodiment of a locking assembly and tie rod attached to the frame.
Figure 33:
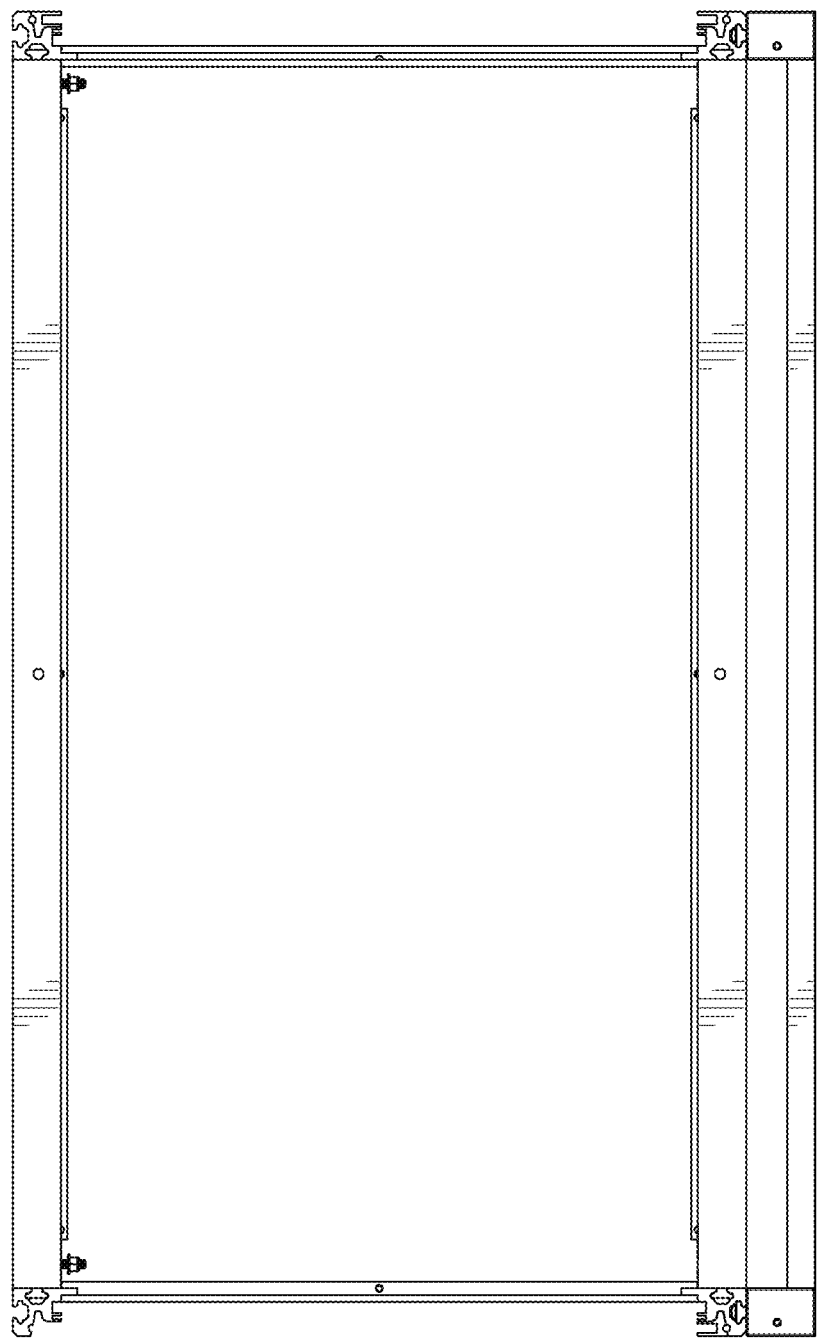
Figure 34:
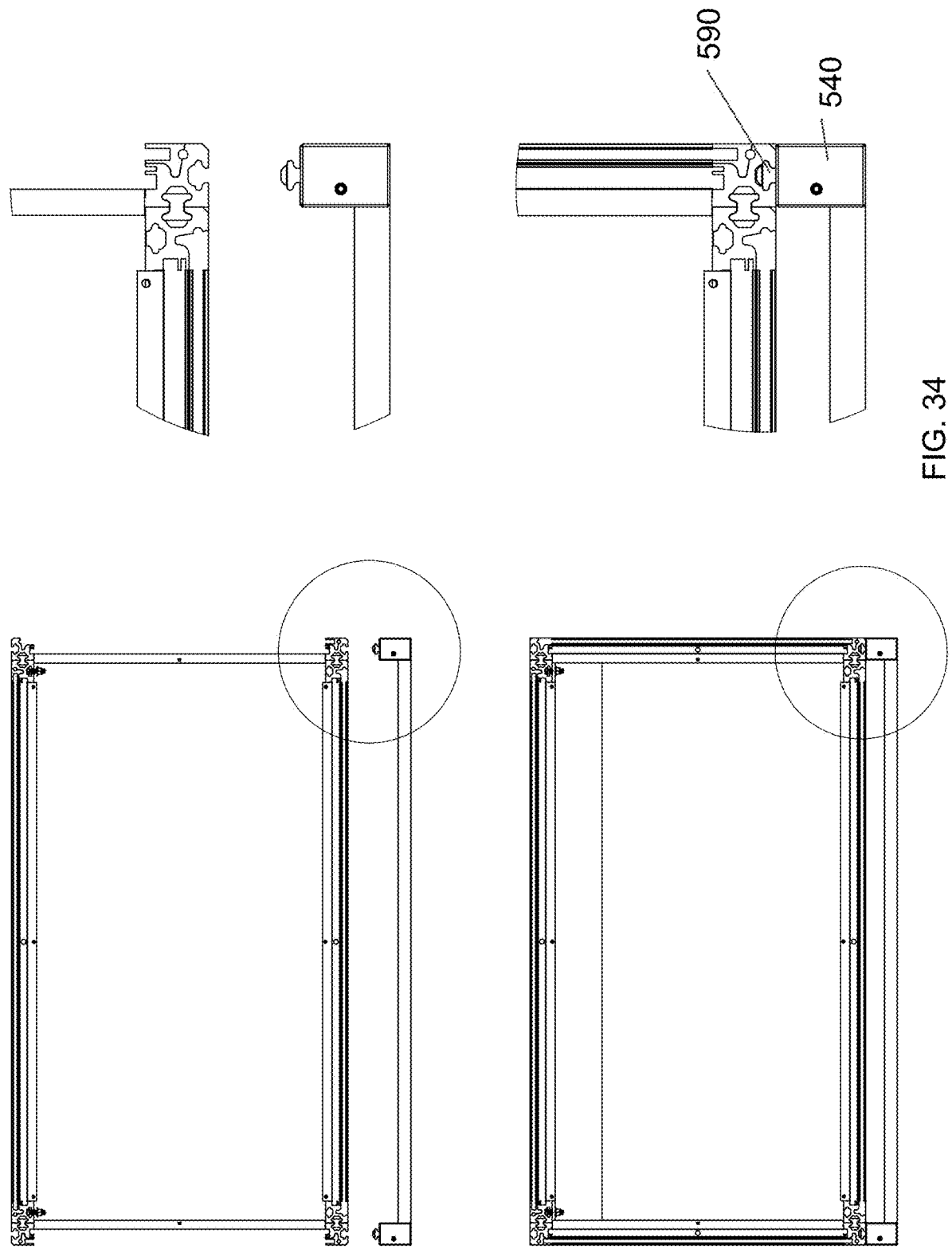

With continued reference to FIGS. 10-14, and now with reference to FIGS. 15-19, the cabinet 212 further comprises at least one locking assembly 262. The locking assembly 262 is configured and positioned for restricting access to the enclosed storage area of the cabinet 212. The locking assembly may also secure any advertising panels configured as herein described with reference to the above-described embodiments to prevent defacing thereof. As depicted in FIG. 15, an embodiment of the locking assembly comprises at least one lock device having a housing 266 configured for receiving first 270, second 272, and third 274 locking pins, each locking pin having opposing first (a) and second (b) ends, the first end configured for receiving a key and the second end configured for receiving a connector. The first locking pin 270 may be oriented substantially parallel to the second locking pin 272, and the third locking pin 274 may be oriented substantially perpendicular to the first 270 and second 272 locking pins.

Figure 10:
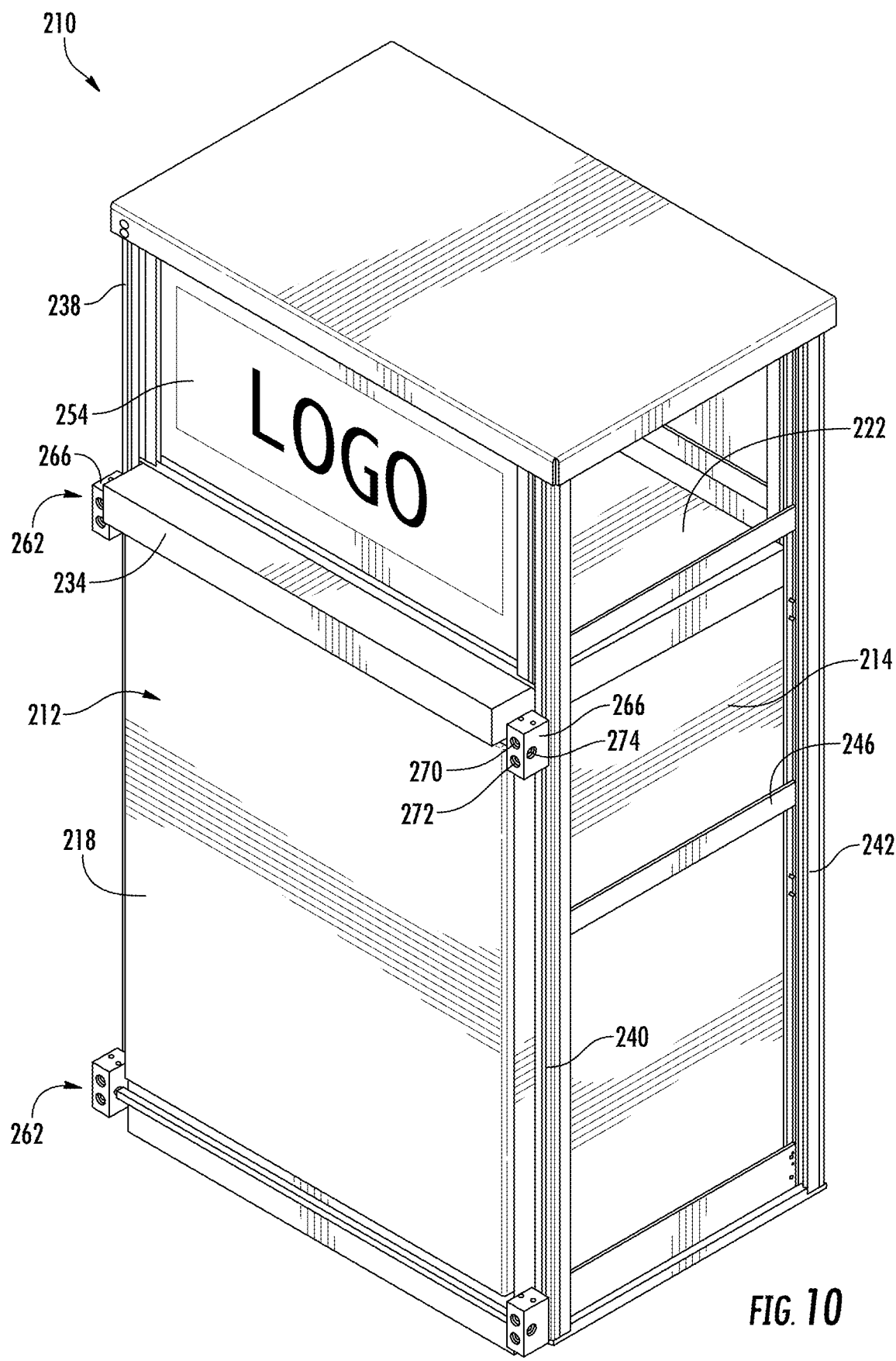
FIG. 10 is a perspective view of one embodiment of the present invention including an advertising medium secured to a traffic signal control cabinet.
Figure 11:
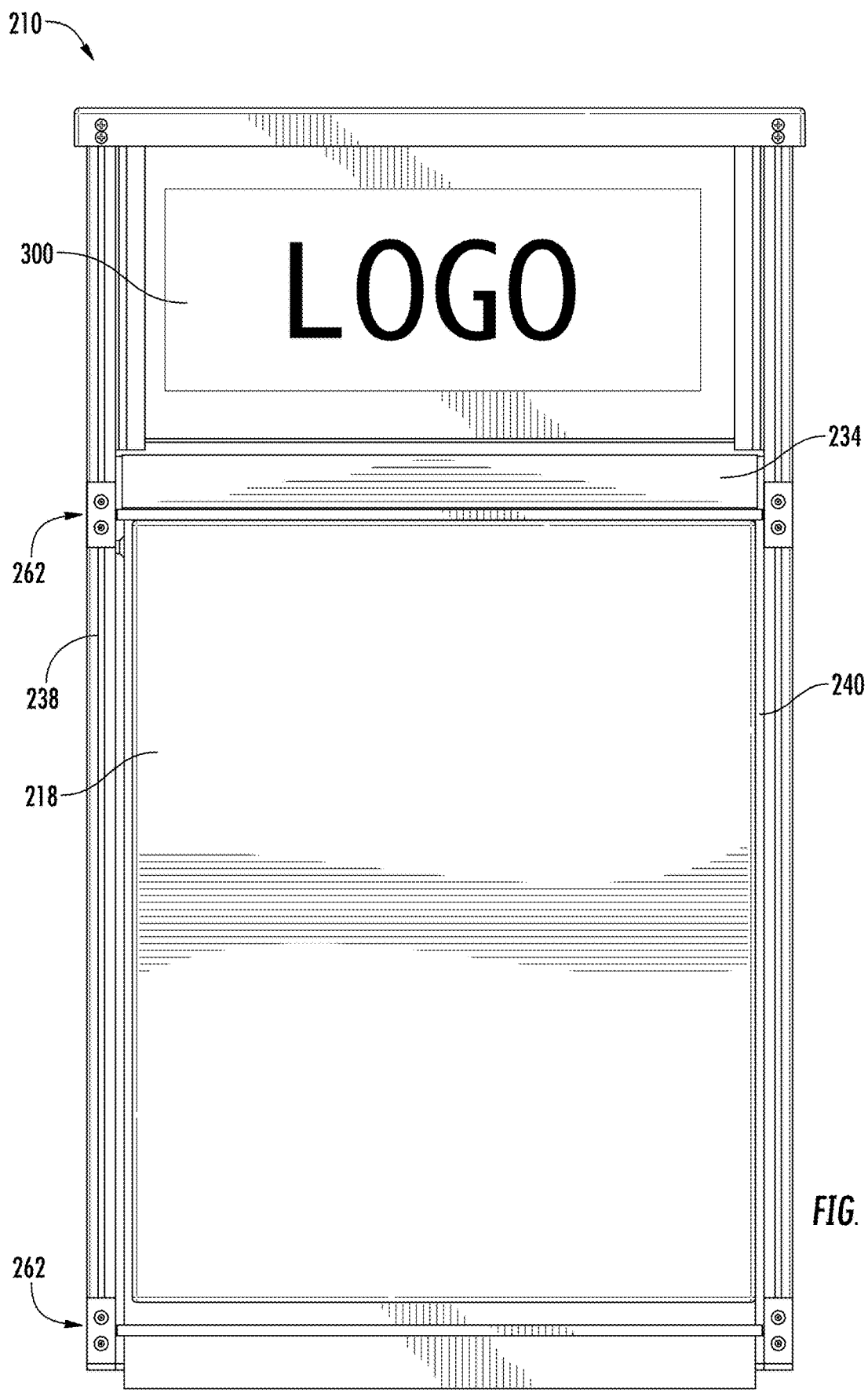
FIG. 11 is a perspective view of a frame assembly of the embodiment of FIG. 1 illustrating selected elements thereof, by way of non-limiting example.
Figure 12:
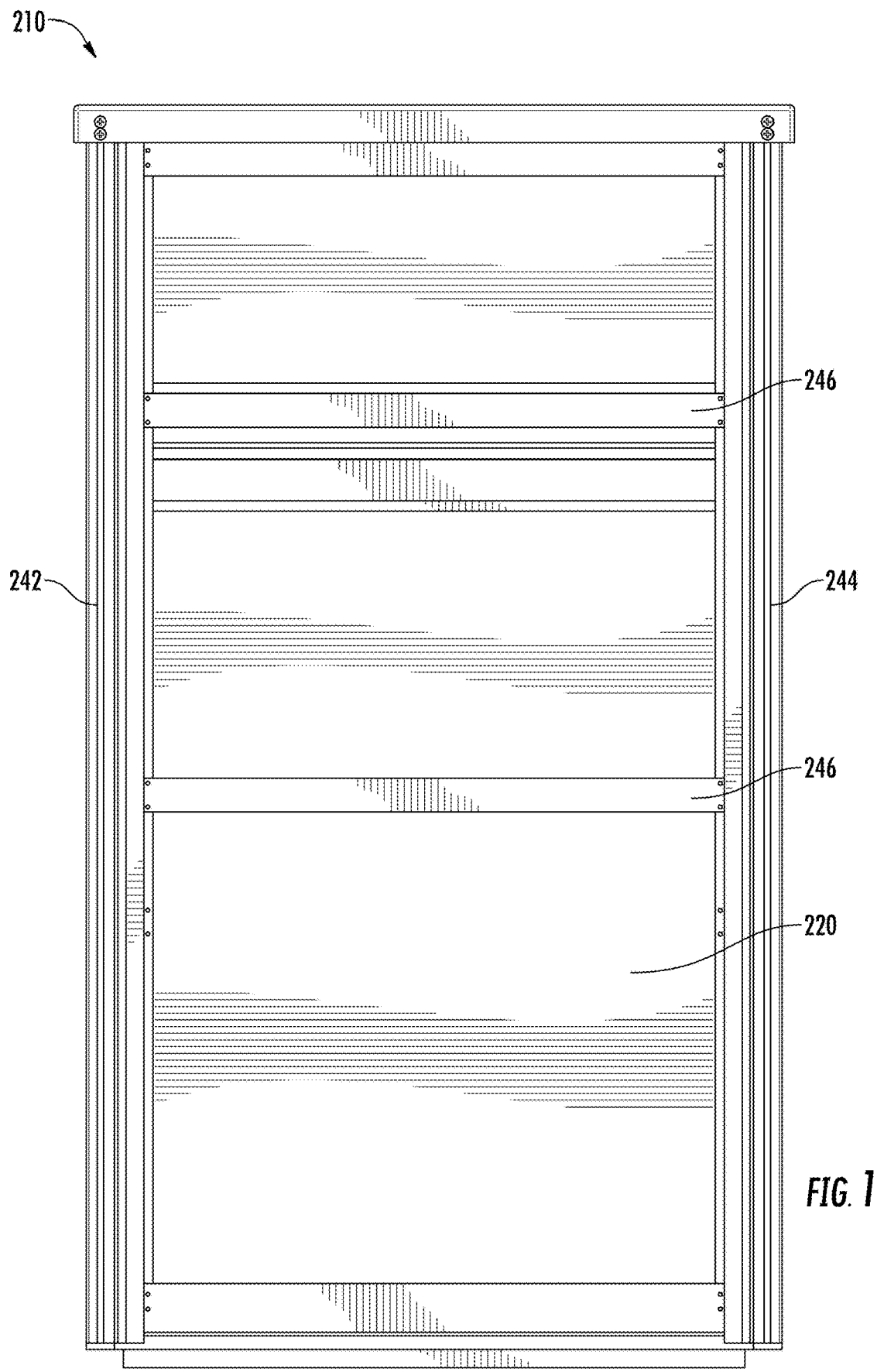
FIG. 12 is a rear perspective view of the frame of the embodiment of FIG. 1 and use thereof.
Figure 13:
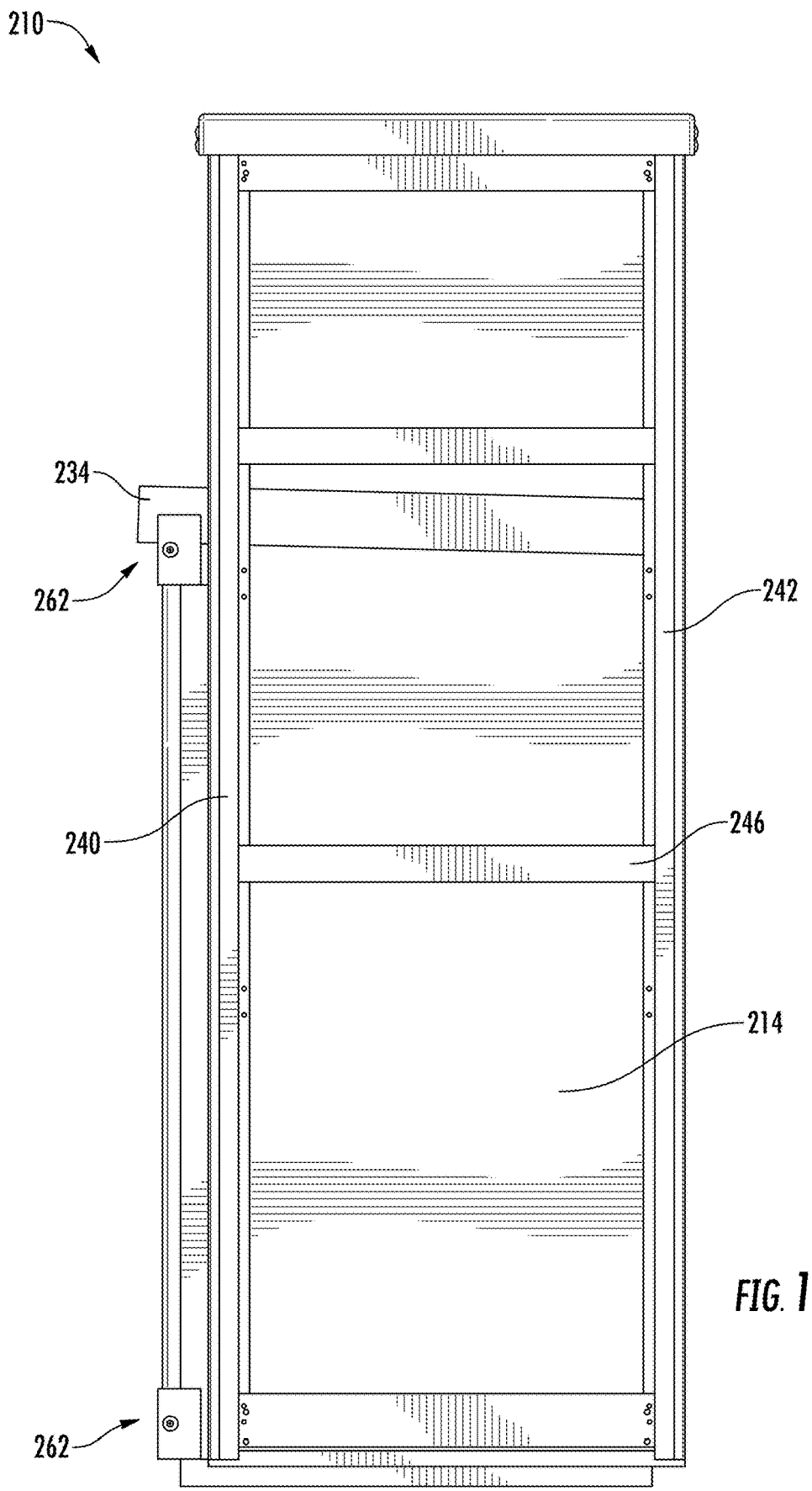
FIG. 13 is a side perspective view of the embodiment of FIG. 1 illustrating the locking assembly portion according to the teachings of the present invention.
Figure 14:
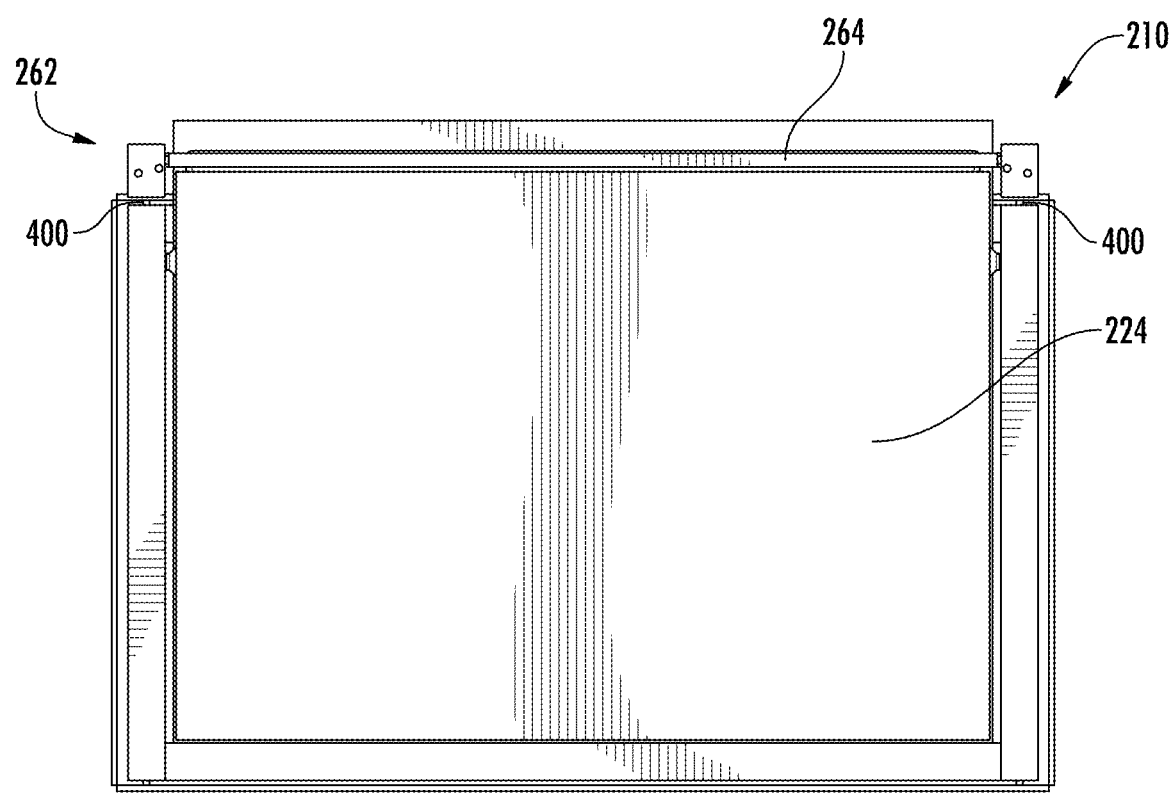
FIG. 14 is a bottom perspective view of the frame of the embodiment of FIG. 1 and use thereof.

As depicted in FIGS. 10-11, the locking assembly 262 may further comprise a second lock device configured in substantially the same manner as the first lock device. The second lock device includes a second housing 266 for receiving fourth 280, fifth 282, and sixth 284 locking pins, each locking pin having opposing first (a) and second (b) ends, the first end configured for receiving a key and the second end configured for receiving a connector. The fourth locking pin may be oriented substantially parallel to the fifth locking pin, and the sixth locking pin may be oriented substantially perpendicular to the fourth and fifth locking pins.

Embodiments of the locking assembly herein described may further comprise a tie rod 264 defining opposing first (c) and second (d) connectors, the first connector (c) configured for being removeably secured to the second end of the third locking pin, and the second connector configured for being removeably secured to the second end of the sixth locking pin. The first and second connectors may comprise a threaded member for being removeably secured to respective locking pins. Other connecting mechanisms, however, are considered to be within the scope of the present disclosure.

With continued reference to FIGS. 15-19, the lock device may further comprise at least one locking bar 290 configured for perpendicularly engaging at least one of the locking pins, thereby preventing the removal of the locking pin from the housing. The locking bar 290 may be held in place by a retaining pin 292 configured for engaging the housing and preventing disengagement of the at least one locking bar 290 from at least one of the locking pins.

By way of example, the advertising medium 210 may comprise first and second connectors 400, the first connector configured for removeably engaging the second end of a first locking pin, and the second connector configured for removeably engaging the second end of a second locking pin. Moreover, the cabinet may further comprises third and fourth connectors, the third connector configured for removeably engaging the second end of a fourth locking pin and the fourth connector configured for removeably engaging the second end of a fifth locking pin.

In one embodiment, the at least one locking assembly comprises a first lock device, a second lock device, and a tie rod extending therebetween, the tie rod defining opposing first and second connectors, the first lock device and the second lock device each comprising a housing configured for receiving first, second, and third locking pins, each locking pin having opposing first and second ends, the first end configured for receiving a key and the second end configured for receiving a connector, the second ends of the first and second locking pins removeably secured to the at least one connector extending from the bar, and the second end of the third locking pin removeably secured to at least one of the first and second connectors of the tie rod.

Exemplary embodiments may also include at least one locking bar configured for preventing removal of at least one of the first, second, and third locking pins from the housing. By way of example, the locking pins may have a notch formed at a portion thereof, wherein the at least one locking bar engages the notch. At least one retaining pin configured for engaging the housing and preventing movement of the at least one locking bar may also be provided.

With continued reference to FIGS. 10-19, another embodiment of the present disclosure includes a locking assembly for restricting access to a traffic control cabinet, the locking assembly comprising a lock device having a housing configured for receiving first, second, and third locking pins, each locking pin having opposing first and second ends, the first end configured for receiving a key and the second end configured for receiving a connector. The locking assembly may further comprise a second lock device having a housing configured for receiving first, second, and third locking pins, each locking pin having opposing first and second ends, the first end configured for receiving a key and the second end configured for receiving a connector.

In one embodiment, the locking assembly includes a tie rod defining opposing first and second connectors, the first connector removeably secured to at least one of the first, second, and third locking pins of the lock device, and the second connector removeably secured to at least one of the first, second, and third locking pins of the second lock device. A first locking bar configured for engaging at least one of the first, second, and third locking pins may be provided. Likewise, a second locking bar configured for engaging at least one of the first, second, and third locking pins may also be provided. In one configuration, the first locking bar engages the first and second pins, and the second locking bar engages the third pin. A retaining pin configured for engaging both the housing and at least one of the first and second locking bars may be provided for additional security.

Second Alternative Embodiment

A second alternative embodiment of the system disclosed herein is depicted in FIGS. 20-35. Referring initially to FIG. 20-23, one alternative embodiment of the present disclosure includes a frame system 500 generally as described herein with a pair of one alternative embodiment of a locking assembly 510 configured for securing the top tie rod 530*a* and a pair of a second alternative embodiment of a locking assembly 520 securing the bottom tie rod 530*b*.

One alternative embodiment of the locking assembly is depicted in FIGS. 24A-26. As shown therein, one or more embodiments of the present disclosure include a locking assembly 510 comprising a housing 540 defining first and second unthreaded bores 550 for receiving first and second locking pins 552, respectively. Embodiments with more than two unthreaded bores 550, and/or more than two locking pins 552, are considered to be within the scope of the present disclosure. One or more embodiments of the housing 540 may define at least eight distinct planar surfaces. Other housing shapes, however, are considered to be within the scope of the present disclosure.

Each unthreaded bore may define a first segment 550*a* having a first diameter and a second segment 550*b* having a second diameter. Embodiments having more than two, or less than two, segments are also considered to be within the scope of the present disclosure. Indeed, one of ordinary skill in the art, having the benefit of the present disclosure, will appreciate that a housing defining an unthreaded bore with a unitary diameter may be constructed without departing from the spirit and scope of the described embodiments. Moreover, embodiments having at least one threaded bore are also envisioned.

In one or more embodiments, the first diameter of each first segment 550*a* is greater than the second diameter of each second segment 550*b*. This enables the housing 540 to define the extent to which a locking pin 552 may be inserted into the bore by providing a surface upon which a portion of the locking pin may abut. In one or more embodiments, each unthreaded bore 550 is substantially parallel to the other unthreaded bore 550. However, the angular relationship between two or more unthreaded (or threaded) bores may vary.

One or more embodiments of the housing 540 may include a channel 560 passing therethrough and defining threaded portions 560*a*, 560*b* on at least one end thereof. In one or more embodiments, the channel 560 defines a threaded portion on each opposing end thereof. The channel 560 may be substantially perpendicular to the first and second unthreaded bores 550, but other angular relationships are considered to be within the scope of the present disclosure.

The housing 540 may also include additional first and second threaded bores 570 for affixing a tie rod 530*a*, 530*b* to the housing 540 with suitable screws 572, wherein the tie rod serves to secure the frame around the cabinet and prevent its removal therefrom. For example, as depicted in FIGS. 20-23, an upper tie rod 530*a* may restrict the upward movement of the frame by interaction with a flange extending from an associated cabinet, and the lower tie rod 530*b* may further restrict the upward movement of the frame by interaction with the lower portion of a door of the associated cabinet.

With continued reference to FIGS. 24A-26, one or more embodiments of the locking assembly 510 may further comprise first and second locking pins 552 defining first 552*a* and second 552*b* segments, respectively, the first segment 552*a* of each locking pin having a first diameter and defining a key receiver, the second segment 552*b* of each locking pin having a second diameter and defining a threaded bore 552*c*, wherein the first diameter of each locking pin is greater than the second diameter of each locking pin. In the embodiment depicted, the various diameters of the locking pins correspond to the various diameters of the unthreaded bores, thereby ensuring a secure fit.

First and second connectors 580 defining a threaded portion 580*a* for engaging the threaded bore 552*c* of the second ends 552*b* of the locking pins 552, respectively, may also be provided, along with first and second slide lock bars 590 each defining a threaded bore 590*a* formed through an intermediate portion thereof for receiving a portion of the first and second connectors 580, respectively. As depicted in FIGS. 30-35, the slide lock bar 590 with a connector 580 passing therethrough may be inserted into a groove 610 in a rail 600 of the frame, thereby providing an anchor point for attaching the locking assembly 510, 520 to the frame. In one or more embodiments, the groove 610 in the frame may be configured to mate with, or complementary to, the size and shape of the slide lock bar(s) 590 and the head of the connector 580 so as to ensure a secure fit. Once the slide lock bar(s) 590 and connector(s) 580 are inserted into a groove 610 in the rail 600, the housing 540 may be attached and secured by inserting the locking pin(s) 552 and the threaded portion of the connector(s) 580 into opposing ends of the unthreaded bore(s) 550, respectively, of the housing 540 and screwing the locking pin(s) 552 onto the threaded portion 580*a* of the connector(s) 580. This configuration enables the locking assembly to be secured at any height along the rail to accommodate varying cabinets by sliding the assembly upward or downward to the desired height before tightening. The head of the locking pin 554 may be configured for receiving a custom-made key in order to prevent removal of the locking assembly by traditional means. For example, as depicted in FIG. 25, the head 552a of the locking pin may define four slots arranged in two pairs of opposing slots for receiving a key or other tool that corresponds to this shape. In one or more embodiments, the pairs of opposing slots are arranged orthogonally. Other slot arrangements, and/or head shape configurations, are within the scope of the present disclosure.

In one or more embodiments, first and second lock bars 700 having a diameter sufficient for entering the channel 560 of the housing 540 are provided, along with first and second retaining pins 710 for engaging the threaded portions of the channel, respectively, and retaining the first and second lock bars 700 in register with the first and second locking pins 552, respectively. By engaging the locking pins 552 with the lock bars 700, the locking pins 552 cannot be removed from the housing 540. In one or more embodiments, the lock bars 700 are secured firmly against a surface of a locking pin 552 by rotation of the retaining pin 710 such that the friction between the lock bar 700 and locking pin 552 prevents removal of the locking pin 552 without first removing the lock bar 700. In another exemplary embodiment, the locking pin 552 may define an aperture for receiving a portion of the lock bar 700 so as to further restrict removal of the locking pin from the housing.

FIGS. 27A-29 depict an alternative embodiment of the locking assembly 520. This embodiment is similar to the embodiment described hereinabove, but only utilizes a housing 540 with a single unthreaded bore 550, a single locking pin 552, and a single slide lock bar 590. This embodiment may be used, for example, when space along the frame is limited by the configuration of the cabinet to be enclosed.

It is to be understood that the invention is not to be limited to the specific embodiments disclosed, and that modifications and alternate embodiments are intended to be included within the scope of the claims supported by this specification. Moreover, the components of one or more embodiments may be used in conjunction with any one of the various embodiments disclosed without departing from the scope of the present disclosure.

What is claimed is:

1. A locking assembly, comprising:
   a housing defining:
   first and second unthreaded bores for receiving first and second locking pins, respectively, each unthreaded bore defining a first segment having a first diameter and a second segment having a second diameter, wherein the first diameter of each first segment is greater than the second diameter of each second segment, each unthreaded bore being substantially parallel to the other unthreaded bore;
   a channel passing through the housing and defining threaded portions on opposing ends thereof, the channel being substantially perpendicular to the first and second unthreaded bores; and
   first and second threaded bores for affixing a tie rod to the housing;
   first and second locking pins defining first and second segments, respectively, the first segment of each locking pin having a first diameter and defining a key receiver, the second segment of each locking pin having a second diameter and defining a threaded bore, wherein the first diameter of each locking pin is greater than the second diameter of each locking pin;
   first and second connectors defining a threaded portion for engaging the threaded bore of the second ends of the locking pins, respectively;
   first and second slide lock bars each defining a threaded bore formed through an intermediate portion thereof for receiving a portion of the first and second connectors, respectively;
   first and second lock bars having a diameter sufficient for entering the channel of the housing; and
   first and second retaining pins for engaging the threaded portions of the channel, respectively, and retaining the first and second lock bars in register with the first and second locking pins, respectively.

2. A locking assembly, comprising:
   a housing defining an unthreaded bore for receiving a locking pin;
   a locking pin;
   at least one connector defining a threaded portion for engaging the locking pin; and
   a slide lock bar defining a threaded bore formed through an intermediate portion thereof for receiving a portion of the connector.

3. The locking assembly according to claim 2, wherein the unthreaded bore defines a first segment having a first diameter and a second segment having a second diameter.

4. The locking assembly according to claim 3, wherein the first diameter of the first segment is greater than the second diameter of each second segment.

5. The locking assembly according to claim 2, wherein the housing defines a channel passing therethrough.

6. The locking assembly according to claim 5, wherein the housing defines threaded portions on opposing ends of the channel.

7. The locking assembly according to claim 6, wherein the channel is substantially perpendicular to the unthreaded bore.

8. The locking assembly according to claim 7, wherein the housing defines a threaded bore for affixing a tie rod to the housing.

9. The locking assembly according to claim 2, wherein the locking pin defines first and second segments, the first segment having a first diameter and defining a key receiver, the second segment having a second diameter and defining a threaded bore for engaging the threaded portion of the connector.

10. The locking assembly according to claim 9, wherein the first diameter of the locking pin is greater than the second diameter of the locking pin.

11. The locking assembly according to claim 6, further comprising a lock bar having a diameter sufficient for entering the channel of the housing.

12. The locking assembly according to claim 11, further comprising a retaining pin for engaging the threaded portion of the channel and retaining the lock bar in register with the locking pin.

* * * * *